(12) United States Patent
Isobe et al.

(10) Patent No.: US 9,553,200 B2
(45) Date of Patent: Jan. 24, 2017

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Atsuo Isobe, Kanagawa (JP); Sachiaki Tezuka, Kanagawa (JP); Shinji Ohno, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 83 days.

(21) Appl. No.: 13/777,119

(22) Filed: Feb. 26, 2013

(65) Prior Publication Data

US 2013/0221347 A1 Aug. 29, 2013

(30) Foreign Application Priority Data

Feb. 29, 2012 (JP) .................................. 2012-044266

(51) Int. Cl.
| | |
|---|---|
| H01L 29/78 | (2006.01) |
| H01L 29/786 | (2006.01) |
| H01L 29/66 | (2006.01) |

(52) U.S. Cl.
CPC ..... *H01L 29/7869* (2013.01); *H01L 29/66742* (2013.01)

(58) Field of Classification Search
CPC ........................ H01L 29/7869; H01L 29/66742
(Continued)

(56) References Cited

U.S. PATENT DOCUMENTS

| 5,731,856 A | 3/1998 | Kim et al. |
|---|---|---|
| 5,744,864 A | 4/1998 | Cillessen et al. |

(Continued)

FOREIGN PATENT DOCUMENTS

| EP | 1209748 A | 5/2002 |
|---|---|---|
| EP | 1 737 044 A1 | 12/2006 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Tran Tran
(74) *Attorney, Agent, or Firm* — Fish & Richardson P.C.

(57) ABSTRACT

An oxide semiconductor layer is formed, a gate insulating layer is formed over the oxide semiconductor layer, a gate electrode layer is formed to overlap with the oxide semiconductor layer with the gate insulating layer interposed therebetween, a first insulating layer is formed to cover the gate insulating layer and the gate electrode layer, an impurity element is introduced through the insulating layer to form a pair of impurity regions in the oxide semiconductor layer, a second insulating layer is formed over the first insulating layer, the first insulating layer and the second insulating layer are anisotropically etched to form a sidewall insulating layer in contact with a side surface of the gate electrode layer, and a source electrode layer and a drain electrode layer in contact with the pair of impurity regions are formed.

22 Claims, 16 Drawing Sheets

(58) Field of Classification Search
USPC .................................. 438/104, 151, 161
See application file for complete search history.

(56) References Cited

U.S. PATENT DOCUMENTS

| | | | |
|---|---|---|---|
| 5,914,498 A | 6/1999 | Suzawa et al. |
| 6,294,274 B1 | 9/2001 | Kawazoe et al. |
| 6,559,478 B1 | 5/2003 | Suzawa et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,122,833 B2 | 10/2006 | Suzawa et al. |
| 7,211,825 B2 | 5/2007 | Shih et al |
| 7,247,562 B2 | 7/2007 | Ishikawa |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,528,406 B2 | 5/2009 | Suzawa et al. |
| 7,674,650 B2 | 3/2010 | Akimoto et al. |
| 7,732,819 B2 | 6/2010 | Akimoto et al. |
| 7,935,964 B2 | 5/2011 | Kim et al. |
| 7,968,886 B2 | 6/2011 | Suzawa et al. |
| 7,998,372 B2 | 8/2011 | Yano et al. |
| 8,164,090 B2 | 4/2012 | Iwasaki et al. |
| 8,168,544 B2 | 5/2012 | Chang |
| 8,198,680 B2 | 6/2012 | Ishikawa |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,343,799 B2 | 1/2013 | Ito et al. |
| 8,384,076 B2 | 2/2013 | Park et al. |
| 8,637,864 B2 | 1/2014 | Saito et al. |
| 8,772,769 B2 | 7/2014 | Yamazaki |
| 8,809,928 B2 | 8/2014 | Sakata |
| 8,884,294 B2 | 11/2014 | Yamazaki et al. |
| 9,171,919 B2 | 10/2015 | Ishikawa |
| 9,209,314 B2 | 12/2015 | Takemura |
| 9,240,488 B2 | 1/2016 | Yamazaki et al. |
| 9,276,129 B2 | 3/2016 | Yamazaki et al. |
| 9,281,412 B2 | 3/2016 | Takemura |
| 9,378,980 B2 | 6/2016 | Yamazaki et al. |
| 9,472,683 B2 | 10/2016 | Takemura |
| 2001/0017417 A1 | 8/2001 | Kuroda |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0229466 A1* | 11/2004 | Ishikawa et al. ............ 438/689 |
| 2005/0017302 A1 | 1/2005 | Hoffman |
| 2005/0017303 A1* | 1/2005 | Ishikawa ........... H01L 29/78675 257/347 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0164582 A1* | 7/2008 | Govindarajan ............... 257/635 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0224239 A1 | 9/2009 | Wakita |
| 2009/0278122 A1 | 11/2009 | Hosono et al. |
| 2009/0280600 A1 | 11/2009 | Hosono et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0084651 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0123136 A1 | 5/2010 | Lee et al. |
| 2010/0295042 A1 | 11/2010 | Yano et al. |
| 2010/0301329 A1 | 12/2010 | Asano et al. |
| 2010/0301457 A1* | 12/2010 | Schroeder ................ G03F 1/14 257/618 |
| 2010/0308335 A1* | 12/2010 | Kim et al. ....................... 257/59 |
| 2011/0062433 A1 | 3/2011 | Yamazaki et al. |
| 2011/0062436 A1 | 3/2011 | Yamazaki et al. |

(56) References Cited

U.S. PATENT DOCUMENTS

| | | | |
|---|---|---|---|
| 2011/0117698 A1 | 5/2011 | Suzawa et al. | |
| 2011/0254089 A1 | 10/2011 | Suzawa et al. | |
| 2011/0284848 A1* | 11/2011 | Yamazaki | H01L 27/1225 257/57 |
| 2011/0287580 A1* | 11/2011 | Yamazaki et al. | 438/104 |
| 2011/0303913 A1 | 12/2011 | Yamazaki et al. | |
| 2012/0161121 A1 | 6/2012 | Yamazaki | |
| 2012/0161124 A1 | 6/2012 | Yamazaki | |
| 2012/0187397 A1* | 7/2012 | Yamazaki | H01L 27/1225 257/43 |
| 2012/0280715 A1 | 11/2012 | Sekine | |
| 2013/0075732 A1 | 3/2013 | Saito et al. | |
| 2013/0092926 A1 | 4/2013 | Yamazaki | |
| 2014/0127868 A1 | 5/2014 | Saito et al. | |
| 2014/0295616 A1 | 10/2014 | Yamazaki | |
| 2016/0293767 A1 | 10/2016 | Yamazaki et al. | |

FOREIGN PATENT DOCUMENTS

| | | |
|---|---|---|
| EP | 2120267 A | 11/2009 |
| EP | 2175493 A | 4/2010 |
| EP | 2 226 847 A2 | 9/2010 |
| EP | 2408011 A | 1/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-085259 A | 3/1994 |
| JP | 07-321338 A | 12/1995 |
| JP | 08-264794 A | 10/1996 |
| JP | 09-219517 A | 8/1997 |
| JP | 10-261793 A | 9/1998 |
| JP | 11-505377 A | 5/1999 |
| JP | 11-168218 A | 6/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-327617 A | 11/2004 |
| JP | 2005-268724 A | 9/2005 |
| JP | 2007-096055 A | 4/2007 |
| JP | 2007-123861 A | 5/2007 |
| JP | 2007-220816 A | 8/2007 |
| JP | 2009-278115 A | 11/2009 |
| JP | 2010-093070 A | 4/2010 |
| JP | 2011-146694 A | 7/2011 |
| JP | 2012-019207 A | 1/2012 |
| JP | 2012-023352 A | 2/2012 |
| WO | 2004/114391 A1 | 12/2004 |
| WO | 2007/058231 A1 | 5/2007 |
| WO | 2007/148601 A1 | 12/2007 |
| WO | 2009/034953 A1 | 3/2009 |
| WO | 2009/093625 A1 | 7/2009 |
| WO | WO-2011/074407 | 6/2011 |
| WO | WO-2011/155502 | 12/2011 |
| WO | WO-2011/158888 | 12/2011 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the IN2O3 and Sc2O3—A2O3—BO Systems [Aa; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

SEMICONDUCTOR DEVICE AND METHOD FOR MANUFACTURING THE SAME

BACKGROUND OF THE INVENTION

1. Field of the Invention

The disclosed invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which transistors are formed using semiconductor thin films formed over a substrate having an insulating surface has been attracting attention. The transistor is applied to a wide range of semiconductor devices such as an integrated circuit (IC) and an image display device (also simply referred to as display device). A silicon-based semiconductor material is widely known as a material for a semiconductor thin film applicable to a transistor. As another material, an oxide semiconductor has been attracting attention.

For example, a technique by which a transistor is formed using zinc oxide or an In—Ga—Zn-based oxide semiconductor as an oxide semiconductor is disclosed (see Patent Documents 1 and 2).

REFERENCE

Patent Document

[Patent Document 1] Japanese Published Patent Application No. 2007-123861

[Patent Document 2] Japanese Published Patent Application No. 2007-096055

SUMMARY OF THE INVENTION

In recent years, miniaturization of integrated circuits such as VLSI has been progressing increasingly, and an improvement in on-characteristics (e.g., on-state current or field-effect mobility) of miniaturized transistors is desired in order to achieve high-speed response and high-speed driving of a semiconductor device. In addition, for miniaturization of transistors, a decrease in the channel length L is required. However, when the channel length L is decreased, the parasitic resistance that is the sum of the resistance between a source and a channel, the resistance between a drain and the channel and the contact resistance significantly affects the on-state current characteristics. Thus, a lowering in the parasitic resistance value is needed for suppressing a decrease in an on-state current.

In view of the above, an object of one embodiment of the present invention is to provide a semiconductor device in which a decrease in the on-state current is suppressed by lowering the parasitic resistance value.

In the invention disclosed in this specification and the like, a pair of impurity regions containing an impurity element causing an oxygen vacancy is provided to be in contact with a channel formation region in an oxide semiconductor layer. The impurity element is introduced into the oxide semiconductor layer through an insulating layer covering a gate electrode layer provided over the oxide semiconductor layer, from a portion above the insulating layer. In the insulating layer covering the gate electrode layer, a region in contact with a side surface of the gate electrode layer has a larger thickness than the other region; thus, the impurity element is less likely to be introduced into a portion in the oxide semiconductor layer, which overlaps with the large-thickness region. Accordingly, in the oxide semiconductor layer, the concentration of impurity which is contained owing to the above impurity introduction treatment varies between on the region. Specifically, a semiconductor device is manufactured, by a manufacturing method below, for example.

One embodiment of the present invention is a method for manufacturing a semiconductor device including the steps of forming an oxide semiconductor layer, forming a gate insulating layer over the oxide semiconductor layer, forming a gate electrode layer overlapping with the oxide semiconductor layer with the gate insulating layer interposed therebetween, forming a first insulating layer to cover the gate insulating layer and the gate electrode layer, introducing an impurity element through the first insulating layer to form a pair of impurity regions in the oxide semiconductor layer, forming a second insulating layer over the first insulating layer, anisotropically etching the first insulating layer and the second insulating layer to form a sidewall insulating layer in contact with a side surface of the gate electrode layer, and forming a source electrode layer and a drain electrode layer in contact with the pair of impurity regions.

Another embodiment of the present invention is a method for manufacturing a semiconductor device including the steps of forming an oxide semiconductor layer, forming a gate insulating layer over the oxide semiconductor layer, forming a gate electrode layer overlapping with the oxide semiconductor layer with the gate insulating layer interposed therebetween, forming a first insulating layer covering the gate insulating layer and the gate electrode layer, introducing an impurity element through the first insulating layer to form a pair of impurity regions in the oxide semiconductor layer, forming a second insulating layer over the first insulating layer, anisotropically etching the first insulating layer and the second insulating layer to form a sidewall insulating layer in contact with a side surface of the gate electrode layer, forming a conductive layer to cover the oxide semiconductor layer, the sidewall insulating layer, and the gate electrode layer, and removing a region of the conductive layer, which overlaps with the gate electrode layer, to form a source electrode layer and a drain electrode layer.

In the above method for manufacturing a semiconductor device, chemical mechanical polishing treatment may be used to remove the conductive layer.

Further, in the above method for manufacturing a semiconductor device, it is preferable that the thickness of the second insulating layer be larger than the thickness of the first insulating layer.

Another embodiment of the present invention is a semiconductor device including an oxide semiconductor layer which includes a pair of impurity regions containing an impurity element and a channel formation region between the pair of impurity regions, a gate electrode layer over the oxide semiconductor layer, a sidewall insulating layer which is in contact with a side surface of the gate electrode layer and contains the impurity element, a source electrode layer in contact with one of the pair of impurity regions in the oxide semiconductor layer, and a drain electrode layer in contact with the other of the pair of impurity regions in the oxide semiconductor layer. In the oxide semiconductor layer, a region in contact with the source electrode layer or the drain electrode layer has a higher impurity concentration than a region overlapping with the sidewall insulating layer.

Further, in the above semiconductor device, it is preferable that the oxide semiconductor layer be provided over a base insulating layer which has a region containing oxygen in excess of the stoichiometric composition.

Further, an oxygen vacancy in an oxide semiconductor is a cause of generation of a carrier. Thus, the impurity region has lower resistance than the channel formation region and serves as a source region or a drain region of a transistor. With the impurity region, resistance of a source or a drain of the transistor can be reduced. In addition, when the source electrode layer or the drain electrode layer is in contact with the oxide semiconductor layer at the impurity region, the contact resistance can be reduced.

Since an oxygen vacancy in the oxide semiconductor causes generation of carrier, a large number of oxygen vacancies in the channel formation region of a transistor leads to generation of electrons serving as a carrier in the channel formation region and is thus a factor causing the shift of the threshold voltage of the transistor in the negative direction. Thus, in order to improve the reliability of the transistor, it is important for providing an impurity region that generation of oxygen vacancies in the channel formation region be reduced as much as possible.

In the transistor according to one embodiment of the present invention, the vicinity of the channel formation region (more specifically, a region overlapping with the sidewall insulating layer) in the oxide semiconductor layer contains no impurity element or contains an impurity element at a lower concentration than regions in the oxide semiconductor layer, which are in contact with the source electrode layer and the drain electrode layer. Thus, introduction of impurity into the channel formation region can be effectively suppressed.

According to one embodiment of the present invention, a semiconductor device in which a decrease in the on-state current is suppressed can be provided.

DETAILED DESCRIPTION OF THE INVENTION

Figure 1A:
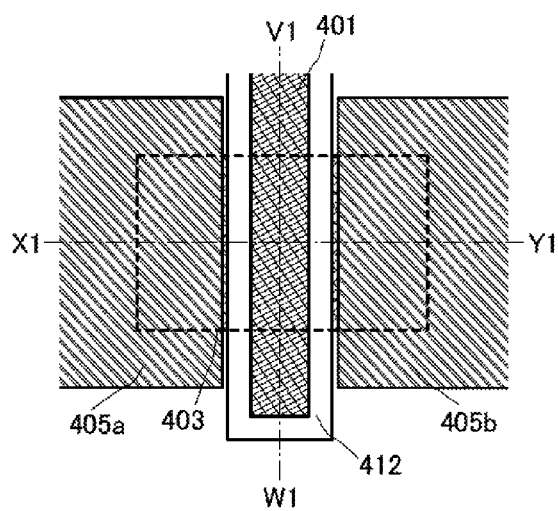
FIGS. 1A to 1C are a plan view and cross-sectional views illustrating one embodiment of a semiconductor device.

Hereinafter, embodiments of the invention disclosed in this specification will be described with reference to the accompanying drawings. However, the invention disclosed in this specification is not limited to the following description, and it will be easily understood by those skilled in the art that modes and details thereof can be variously changed. Therefore, the invention disclosed in this specification is not construed as being limited to the description of the following embodiments. Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in this specification and the like, ordinal numbers such as "first", "second", and the like are used in order to avoid confusion among components and do not limit the number.

(Embodiment 1)

In this embodiment, one embodiment of a semiconductor device and a method for manufacturing the semiconductor device will be described with reference to FIGS. 1A to 1C, FIGS. 2A to 2C, and FIGS. 3A to 3C. In this embodiment, a transistor including an oxide semiconductor layer is shown as an example of the semiconductor device.

Figure 1C:
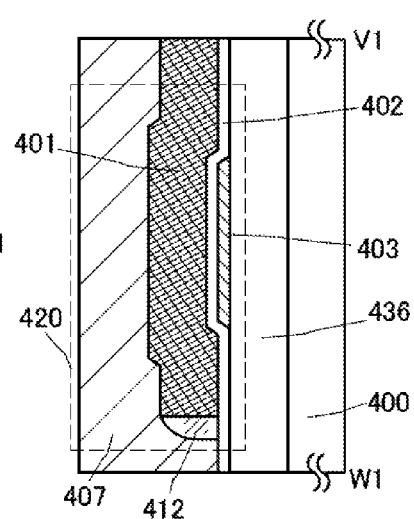
Figure 1B:
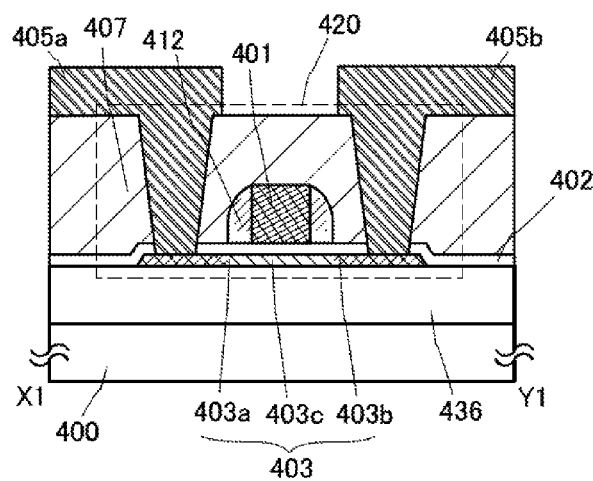

FIGS. 1A to 1C illustrate a structure example of a transistor 420. FIG. 1A is a plan view of the transistor 420, FIG. 1B is a cross-sectional view taken along the line X1-Y1 in FIG. 1A, and FIG. 1C is a cross-sectional view taken along the line V1-W1 in FIG. 1A. Note that in FIG. 1A, some components of the transistor 420 (e.g., an insulating layer 407 and the like) are not illustrated to avoid complexity.

The transistor 420 illustrated in FIGS. 1A to 1C includes the following components over a substrate 400: an oxide semiconductor layer 403 which includes a pair of impurity regions 403a and 403b and a channel formation region 403c; a gate insulating layer 402 over the oxide semiconductor layer 403; a gate electrode layer 401 overlapping with the channel formation region 403c with the gate insulating layer 402 interposed therebetween; a sidewall insulating layer 412 in contact with a side surface of the gate electrode layer 401; a source electrode layer 405a; and a drain electrode layer 405b. In the oxide semiconductor layer 403, the channel formation region 403c is provided between the impurity region 403a and the impurity region 403b. Further, the source electrode layer 405a is electrically connected to the oxide semiconductor layer 403 at the impurity region 403a, and the drain electrode layer 405b is electrically connected to the oxide semiconductor layer 403 at the impurity region 403b.

In the oxide semiconductor layer 403, the impurity region 403a and the impurity region 403b are regions formed by introduction of an impurity element causing generation of an oxygen vacancy into the oxide semiconductor layer 403. The oxygen vacancy in the oxide semiconductor is a cause of generation of a carrier in the oxide semiconductor. Thus, the impurity region 403a and the impurity region 403b in which oxygen vacancies are intentionally generated are regions with lower resistance than the channel formation region 403c and function as a source region and a drain region. With the impurity region 403a and the impurity region 403b, resistance of the source or the drain can be lowered; accordingly, electric characteristics (e.g., on-state current characteristics) of the transistor 420 can be improved.

In the oxide semiconductor layer 403, a region in contact with the source electrode layer 405a or the drain electrode layer 405b contains the impurity element at a higher concentration than a region overlapping with the sidewall insulating layer 412 (i.e., the region is adjacent to the channel formation region 403c). Further, the sidewall insulating layer 412 has a region containing the same impurity element as the impurity element contained in the impurity regions 403a and 403b.

Further, a base insulating layer 436 provided over the substrate 400 and/or the insulating layer 407 may be included as components of the transistor 420.

In the base insulating layer 436, a region in contact with the channel formation region 403c of the oxide semiconductor layer 403 is preferably a region containing oxygen in excess of the stoichiometric composition (hereinafter, also referred to as oxygen excess region). When the base insulating layer 436 in contact with the channel formation region 403c includes an oxygen excess region, oxygen can be supplied to the channel formation region 403c. Thus, it becomes possible to prevent a release of oxygen from the channel formation region 403c and to fill oxygen vacancies in the channel formation region.

Furthermore, in the base insulating layer 436, regions in contact with the impurity region 403a and the impurity region 403b are regions to which an impurity may be added in the treatment for introducing the impurity element to the impurity region 403a and the impurity region 403b.

The oxide semiconductor layer 403 may be in a non-single-crystal state, for example. The non-single-crystal state is, for example, structured by at least one of c-axis aligned crystal (CAAC), polycrystal, microcrystal, and an amorphous part.

The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor). For example, an oxide semiconductor layer may include a CAAC-OS. In the CAAC-OS, for example, c-axes are aligned, and a-axes and/or b-axes are not macroscopically aligned.

For example, the oxide semiconductor layer 403 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, the oxide semiconductor layer 403 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor layer 403 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that the oxide semiconductor layer 403 may be in a single-crystal state, for example.

The channel formation region 403c of the oxide semiconductor layer 403 preferably includes a plurality of crystal parts. In each of the crystal parts, a c-axis is preferably aligned in a direction parallel to a normal vector of a surface where the oxide semiconductor layer is formed or a normal vector of a surface of the oxide semiconductor layer. Note that, among crystal parts, the directions of the a-axis and the b-axis of one crystal part may be different from those of another crystal part. An example of such an oxide semiconductor layer is a CAAC-OS film. In other words, the channel formation region 403c of the oxide semiconductor layer 403 is preferably a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

An example of a method for manufacturing the transistor 420 is described with reference to FIGS. 2A to 2C and FIGS. 3A to 3C.

First, the base insulating layer 436 is formed over the substrate 400 having an insulating surface.

There is no particular limitation on a substrate that can be used as the substrate 400 having an insulating surface as long as it has at least heat resistance enough to withstand heat treatment in a later step. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. In order to manufacture a flexible semiconductor device, the transistor 420 including the oxide semiconductor layer 403 may be directly formed over a flexible substrate; or alternatively, the transistor 420 including the oxide semiconductor layer 403 may be formed over a manufacturing substrate and then separated and transferred to a flexible substrate. Note that in order to separate the transistor 420 from the manufacturing substrate and transfer it to the flexible substrate, a separation layer may be provided between the manufacturing substrate and the transistor 420 including the oxide semiconductor layer.

The base insulating layer 436 can be formed by a plasma CVD method, a sputtering method, or the like to have a single-layer structure including silicon oxide, silicon nitride, silicon oxynitride, silicon nitride oxide, aluminum oxide, aluminum nitride, aluminum oxynitride, aluminum nitride oxide, hafnium oxide, gallium oxide, or a mixed material including any of them, or a stacked structure including any of the above materials. Note that the base insulating layer 436 preferably has a single-layer structure or a stacked structure including an oxide insulating layer so that the oxide insulating layer is in contact with the oxide semiconductor layer 403 to be formed later. Note that the base insulating layer 436 is not necessarily provided.

It is preferable that the base insulating layer 436 include an oxygen excess region. This is because oxygen vacancies in the channel formation region 403c of the oxide semiconductor layer 403, which is formed in a later step, can be filled with excess oxygen contained in the base insulating layer 436. In the case where the base insulating layer 436 has a stacked structure, an oxygen excess region is preferably included in at least a layer (preferably, an oxide insulating layer) in contact with the oxide semiconductor layer 403. In order to provide the oxygen excess region in the base insulating layer 436, for example, the base insulating layer 436 may be formed in an oxygen atmosphere. Alternatively, the oxygen excess region may be formed by introducing oxygen (including at least one of an oxygen radical, an oxygen atom, and an oxygen ion) into the base insulating layer 436 after its formation. Oxygen can be introduced by an ion implantation method, an ion doping method, a plasma immersion ion implantation method, plasma treatment, or the like.

The base insulating layer 436 preferably includes a silicon nitride film, a silicon nitride oxide film, or an aluminum oxide film being in contact with the bottom surface of a layer having an oxygen excess region. When the base insulating layer 436 includes a silicon nitride film, a silicon nitride oxide film, or an aluminum oxide film, diffusion of an impurity to the oxide semiconductor layer 403 can be prevented.

Planarization treatment may be performed on a region of the base insulating layer 436, which is in contact with the oxide semiconductor layer 403. As the planarization treatment, polishing treatment (e.g., a chemical mechanical polishing method), dry-etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the base insulating layer 436.

As the planarization treatment, polishing treatment, dry etching treatment, or plasma treatment may be performed plural times, or these treatments may be performed in combination. In the case where the treatments are performed in combination, the order of steps is not particularly limited and may be set as appropriate depending on the roughness of the surface of the base insulating layer 436.

In order to reduce impurities such as hydrogen (including water and a hydroxyl group) and make the base insulating layer 436 an oxygen-excess film, heat treatment (dehydration or dehydrogenation) for removing hydrogen including water and a hydroxyl group and/or oxygen doping treatment may be performed on the base insulating layer 436. The dehydration or dehydrogenation and the oxygen doping treatment each may be performed plural times, and may be combined and repeated.

Figure 2A:
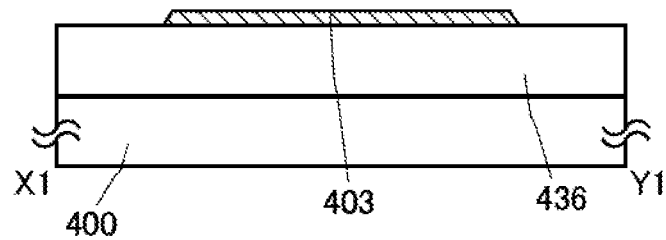
FIGS. 2A to 2C are cross-sectional views illustrating an example of a method for manufacturing a semiconductor device.
Figure 2B:
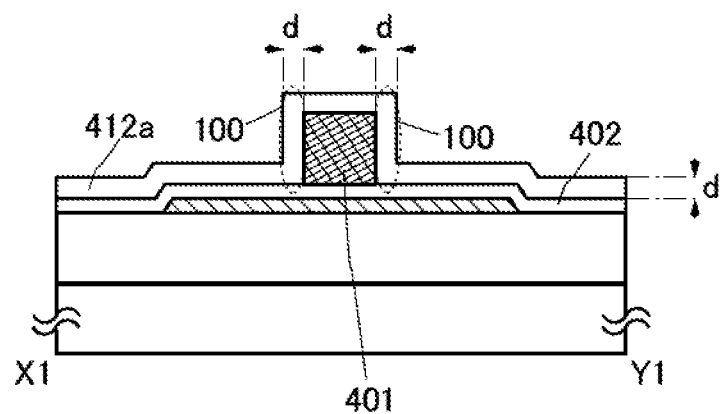
Figure 2C:
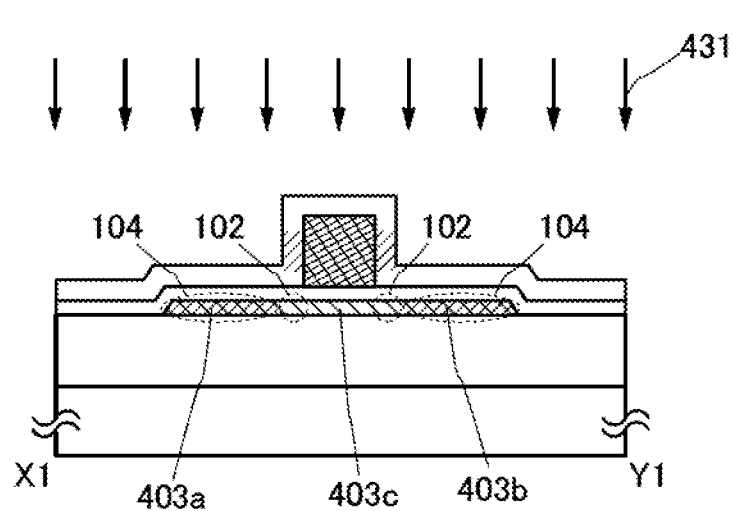

Next, an oxide semiconductor layer is formed over the base insulating layer 436 and processed into an island shape to form the oxide semiconductor layer 403 (see FIG. 2A).

The thickness of the oxide semiconductor layer 403 is, for example, 1 nm to 30 nm, preferably 5 nm to 10 nm.

The oxide semiconductor layer may have either a single-layer structure or a stacked structure. Further, the oxide semiconductor layer may either have an amorphous structure or a crystalline structure. In the case where the oxide semiconductor layer has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., even further preferably higher than or equal to 550° C. Note that the heat treatment can also serve as another heat treatment in the manufacturing process.

As a method for forming the oxide semiconductor layer, a sputtering method, a molecular beam epitaxy (MBE) method, a chemical vapor deposition (CVD) method, a pulse laser deposition method, an atomic layer deposition (ALD) method, or the like can be used as appropriate.

In the formation of the oxide semiconductor layer, the hydrogen concentration in the oxide semiconductor layer is preferably reduced as much as possible. In order to reduce the hydrogen concentration, for example, in the case where the oxide semiconductor layer is formed by a sputtering method, oxygen, a high-purity rare gas (typically, argon) from which impurities such as hydrogen, water, a hydroxyl group, and a hydride are removed, or a mixed gas of oxygen and the rare gas is used as appropriate as an atmosphere gas supplied to a deposition chamber of a sputtering apparatus.

The oxide semiconductor layer is formed in such a manner that a sputtering gas from which hydrogen and moisture are removed is introduced into a deposition chamber while moisture remaining in the deposition chamber is removed, whereby the concentration of hydrogen in the deposited oxide semiconductor layer can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. A cryopump has a high capability in removing a hydrogen molecule, a compound containing a hydrogen atom such as water ($H_2O$) (preferably, also a compound containing a carbon atom), and the like; thus, the impurity concentration in the oxide semiconductor layer formed in the deposition chamber which is evacuated with the cryopump can be reduced.

Further, when the oxide semiconductor layer is formed by a sputtering method, the relative density (filling rate) of a metal oxide target that is used for the deposition is greater than or equal to 90% and less than or equal to 100%, preferably greater than or equal to 95% and less than or equal to 99.9%. With use of a metal oxide target with a high relative density, a dense oxide semiconductor layer can be deposited.

Further, to reduce the impurity concentration in the oxide semiconductor layer, it is also effective to form the oxide semiconductor layer while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. The crystalline oxide semiconductor layer can be formed by heating the substrate at a high temperature in the formation.

In the case where a CAAC-OS film is employed as the oxide semiconductor layer 403, the following three methods can be used for forming the CAAC-OS film as examples. One of methods is to form an oxide semiconductor layer at a film formation temperature higher than or equal to 200° C. and lower than or equal to 450° C., thereby obtaining c-axis alignment substantially perpendicular to a surface. Another method is to form a thin oxide semiconductor layer and then subject the layer to heat treatment performed at a temperature higher than or equal to 200° C. and lower than or equal to 700° C., thereby obtaining c-axis alignment substantially perpendicular to a surface. The other method is to form a first thin oxide semiconductor layer, subject the layer to heat treatment performed at a temperature higher than or equal to 200° C. and lower than or equal to 700° C., and then form a second oxide semiconductor layer, thereby obtaining c-axis alignment substantially perpendicular to a surface.

An oxide semiconductor used for the oxide semiconductor layer 403 contains at least indium (In). In particular, indium and zinc (Zn) are preferably contained. As a stabilizer for reducing variation in electric characteristics of a transistor using the oxide semiconductor, gallium (Ga) is preferably additionally contained. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is a natural number) may be used.

For example, an In—Ga—Zn-based oxide with an atomic ratio where In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—

Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, an oxide semiconductor containing indium that is included in a transistor is not limited to the materials given above; a material with an appropriate composition may be used for a transistor including an oxide semiconductor containing indium depending on needed electrical characteristics (e.g., field-effect mobility, threshold voltage, and variation). In order to obtain the needed electrical characteristics, the carrier concentration, the impurity concentration, the defect density, the atomic ratio between a metal element and oxygen, the interatomic distance, the density, and the like are preferably set to appropriate values.

For example, high field-effect mobility can be obtained relatively easily in a transistor including an In—Sn—Zn-based oxide. Also in the case of a transistor including an In—Ga—Zn-based oxide, the field-effect mobility can be increased by reducing the defect density in a bulk.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2$ $r^2$, and r may be 0.05, for example. For example, r may be 0.05. The same applies to other oxides.

In this embodiment, the oxide semiconductor layer 403 has a single-layer structure. However, the oxide semiconductor layer 403 can have a stacked structure in which a plurality of oxide semiconductor layers are stacked. For example, the oxide semiconductor layer 403 may be a stacked layer of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using three-component metal oxides.

Further, the constituent elements of the first oxide semiconductor layer and the second oxide semiconductor layer may be the same as each other but the composition of the constituent elements of the first oxide semiconductor layer and the second oxide semiconductor layer may be different from each other. For example, the first oxide semiconductor layer may have an atomic ratio of In:Ga:Zn=1:1:1, and the second oxide semiconductor layer may have an atomic ratio of In:Ga:Zn=3:1:2. Alternatively, the atomic ratio of In to Ga and Zn in the first oxide semiconductor layer may be 1:3:2, and the atomic ratio of In to Ga and Zn in the second oxide semiconductor layer may be 2:1:3.

At this time, one of the first oxide semiconductor layer and the second oxide semiconductor layer, which is closer to the gate electrode (which is on the channel side), preferably contains In and Ga at a proportion of In >Ga. The other which is farther from the gate electrode (which is the back channel side) preferably contains In and Ga at a proportion of In≤Ga.

In an oxide semiconductor, the s orbital of heavy metal mainly contributes to carrier transfer, and when the In content in the oxide semiconductor is increased, the overlap of the s orbitals is likely to be increased. Therefore, an oxide having a composition where In >Ga has higher mobility than an oxide having a composition where In≤Ga. Further, in Ga, the energy for formation of oxygen vacancy is larger and thus oxygen vacancy is less likely to occur, than in In; therefore, the oxide having a composition where In≤Ga has more stable characteristics than the oxide having a composition where In >Ga.

Application of an oxide semiconductor containing In and Ga at a proportion where In >Ga on a channel side, and an oxide semiconductor containing In and Ga at a proportion where In≤Ga on a back channel side allows the mobility and reliability of the transistor to be further improved.

Further, oxide semiconductors whose crystallinities are different from each other may be employed for the first and second oxide semiconductor layers. That is, two of a single crystal oxide semiconductor, a polycrystalline oxide semiconductor, an amorphous oxide semiconductor, and a CAAC-OS may be combined as appropriate. When an amorphous oxide semiconductor is used for at least one of the first oxide semiconductor layer and the second oxide semiconductor layer, internal stress or external stress of the oxide semiconductor layer 403 is relieved, variation in characteristics of a transistor is reduced, and reliability of the transistor can be further improved.

On the other hand, the amorphous oxide semiconductor is likely to absorb impurities such as hydrogen, and oxygen vacancies are likely to be generated, so that amorphous oxide semiconductor is likely to be made n-type. For this reason, it is preferable to apply an oxide semiconductor having the crystallinity such as a CAAC-OS to the oxide semiconductor layer including the channel formation region.

Further, the oxide semiconductor layer 403 is preferably subjected to heat treatment for removing excess hydrogen, including water and a hydroxyl group, (dehydration or dehydrogenation) contained in the oxide semiconductor layer 403. The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an impurity imparting n-type conductivity, can be removed from the oxide semiconductor by the heat treatment. For example, the hydrogen concentration in the oxide semiconductor layer 403 after the dehydration or dehydrogenation can be lower than or equal to $5 \times 10^{19}$ $cm^{-3}$, preferably lower than or equal to $5 \times 10^{18}$ $cm^{-3}$.

Note that the heat treatment for the dehydration or dehydrogenation may be performed at any timing in the manufacturing process of the transistor 420 as long as the heat treatment is performed after the formation of the oxide semiconductor layer. The heat treatment for dehydration or dehydrogenation may be performed plural times, and may also serve as another heat treatment.

Note that in the case where an insulating layer containing oxygen is provided as the base insulating layer 436, the heat treatment for the dehydration or dehydrogenation is preferably performed before the oxide semiconductor layer is processed into an island shape because oxygen contained in the base insulating layer 436 can be prevented from being released by the heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer 403 is heated by the heat treatment, a high-purity oxygen gas, a high-purity dinitrogen gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor to compensate for a reduction of oxygen in the step for removing an impurity for the dehydration or dehydrogenation, so that the oxide semiconductor layer 403 can be a highly-purified and i-type (intrinsic) oxide semiconductor film.

Since there is a possibility that oxygen, which is a main component of an oxide semiconductor, is also released and reduced by dehydration or dehydrogenation treatment, oxygen (including at least one of an oxygen radical, an oxygen atom, and an oxygen ion) may be introduced to the oxide semiconductor layer which has been subjected to the dehydration or dehydrogenation treatment to supply oxygen to the layer.

Oxygen is added to the dehydrated or dehydrogenated oxide semiconductor layer to be supplied thereto, so that the oxide semiconductor layer can be highly purified and be i-type (intrinsic). Variation in electric characteristics of a transistor having the highly-purified and i-type (intrinsic) oxide semiconductor is suppressed, and the transistor is electrically stable.

In the step of addition of oxygen to the oxide semiconductor layer, oxygen may be directly added to the oxide semiconductor layer 403 or may be added to the oxide semiconductor layer 403 through another film such as the gate insulating layer 402 or the insulating layer 407 to be formed later. When oxygen is introduced through another film, an ion implantation method, an ion doping method, a plasma immersion ion implantation method, or the like may be used. In the case where oxygen is directly introduced into the oxide semiconductor layer 403, plasma treatment or the like can be used in addition to the above-described methods.

As a gas for supplying oxygen, a gas containing O may be used; for example, an $O_2$ gas, an $N_2O$ gas, a $CO_2$ gas, a CO gas, or an $NO_2$ gas may be used. Note that a rare gas (e.g., an Ar gas) may be contained in the supply gas of the oxygen.

For example, in the case where an oxygen ion is introduced into the oxide semiconductor layer 403 by an ion implantation method, the dose can be greater than or equal to $1\times10^{13}$ ions/cm$^2$ and less than or equal to $5\times10^{16}$ ions/cm$^2$.

Alternatively, oxygen may be supplied to the oxide semiconductor layer 403 in the following manner: an insulating layer in contact with the oxide semiconductor layer 403 is formed to have an oxygen excess region; and heat treatment is performed in a state where the insulating layer and the oxide semiconductor layer 403 are in contact with each other, so that excess oxygen contained in the insulating layer is diffused to the oxide semiconductor layer 403. This heat treatment can serve as other heat treatment in the process for manufacturing the transistor 420.

The timing of supply of oxygen to the oxide semiconductor layer is not particularly limited to the above as long as it is after the formation of the oxide semiconductor layer. The step of introducing oxygen into the oxide semiconductor layer may be performed plural times. Further, in the case where the oxide semiconductor layer has a stacked structure of a plurality of layers, heat treatment for dehydration or dehydrogenation and/or oxygen supply may be performed separately on each oxide semiconductor layer or may be performed once on the oxide semiconductor layer 403 after the oxide semiconductor layer 403 having a stacked structure is formed.

The base insulating layer 436 and the oxide semiconductor layer 403 are preferably formed in succession without being exposed to air. By the successive formation of the base insulating layer 436 and the oxide semiconductor layer 403 without being exposed to air, impurities such as hydrogen and moisture can be prevented from being adsorbed onto a surface of the base insulating layer 436.

The oxide semiconductor layer 403 can be formed by processing an oxide semiconductor layer into an island shape by a photolithography step. Note that a resist mask used for formation of the island-shaped oxide semiconductor layer 403 may be formed by an inkjet method. For formation of the resist mask by an inkjet method, a photomask is not needed; thus, manufacturing cost can be reduced.

Next, the gate insulating layer 402 is formed over the oxide semiconductor layer 403. The gate insulating layer 402 can be formed to have a thickness greater than or equal to 1 nm and less than or equal to 20 nm by a sputtering method, an MBE method, a CVD method, a pulse laser deposition method, an ALD method, or the like as appropriate.

To improve the coverage with the gate insulating layer 402, the above-described planarization treatment may be performed also on the top surface of the oxide semiconductor layer 403. In particular, in the case where a thin insulating layer is used as the gate insulating layer 402, it is preferable that the oxide semiconductor layer 403 have improved surface flatness.

The gate insulating layer 402 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating layer 402 include oxygen in a portion which is in contact with the oxide semiconductor layer 403. In particular, the gate insulating layer 402 preferably contains, in the film (bulk), oxygen in excess of the stoichiometric composition. For example, in the case where a silicon oxide film is used as the gate insulating layer 402, the composition formula is preferably $SiO_{2+\alpha}$ ($\alpha>0$). Further, the gate insulating layer 402 is preferably formed in consideration of the size of a transistor to be formed and the step coverage with the gate insulating layer 402.

Further, as a material of the gate insulating layer 402, hafnium oxide, yttrium oxide, hafnium silicate ($HfSi_xO_y$, ($x>0$, $y>0$)), hafnium silicate to which nitrogen is added ($HfSi_xO_yN_z$ ($x>0$, $y>0$, $z>0$)), hafnium aluminate ($HfAl_xO_y$, ($x>0$, $y>0$)), lanthanum oxide, or the like may be used. Further, the gate insulating layer 402 may have either a single-layer structure or a stacked structure.

To reduce impurities such as hydrogen (including water and a hydroxyl group) and make the gate insulating layer 402 an oxygen-excess film, heat treatment (dehydration or dehydrogenation) for removing hydrogen (including water and a hydroxyl group) and/or oxygen doping treatment may be performed on the gate insulating layer 402. The dehydration or dehydrogenation and the oxygen doping treatment each may be performed plural times, and may be combined and repeated.

Next, a conductive film is formed over the gate insulating layer 402 and then etched, so that the gate electrode layer 401 is formed. Then, an insulating layer 412a is formed over the gate insulating layer 402 so as to cover the gate electrode layer 401 (see FIG. 2B).

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating layer 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV (electron volts) or higher, preferably 5.5 eV or higher, which enables the threshold voltage of the transistor to take a positive value when used as the gate electrode layer, so that a switching element of so-called normally-off type can be achieved.

As the insulating layer 412a, for example, a silicon oxide film, a silicon nitride film, a silicon oxynitride film, a silicon nitride oxide film, an aluminum oxide film, or the like can be used. The insulating layer 412a can have either a single-layer structure or a stacked structure, and the thickness thereof is preferably greater than or equal to 20 nm and less than or equal to 50 nm. Further, the insulating layer 412a is preferably formed by a CVD method such as an LPCVD method or a plasma CVD method. In this embodiment, as the insulating layer 412a, a silicon oxide film is formed by a plasma CVD method. A plasma CVD method which enables the insulating layer 412a to be formed thick is advantageous in productivity because attachment or entry of dust or the like into a film at the film formation is unlikely to occur and the film can be formed at relatively high deposition rate.

Here, the insulating layer 412a covers the gate electrode layer 401 with a larger thickness than the oxide semiconductor layer 403 and the gate insulating layer 402; thus, in the insulating layer 412a, the thickness of a region 100 adjacent to a side surface of the gate electrode layer 401 is larger than that of the other region. Specifically, in the case where the thickness of the insulating layer 412a is represented by d in FIG. 2B, in the region 100 where the distance from the side surface of the gate electrode layer 401 is within d, the thickness in the insulating layer 412a is increased by up to the thickness of the gate electrode layer 401.

Next, with use of the gate electrode layer 401 as a mask, an impurity element 431 is introduced to the oxide semiconductor layer 403 through the insulating layer 412a. Accordingly, the impurity region 403a and the impurity region 403b are formed in a self-aligned manner (see FIG. 2C). In addition, the channel formation region 403c is formed between the impurity region 403a and the impurity region 403b.

The impurity element 431 is introduced into the oxide semiconductor layer 403 in order to generate an oxygen vacancy therein. Specifically, as the impurity element 431, the following elements can be used: an element such as a rare gas which gives physical damage to the oxide semiconductor layer 403 in the introduction treatment to cause an oxygen vacancy; and an element which is bonded to oxygen in the oxide semiconductor layer 403 after the introduction treatment to cause an oxygen vacancy (e.g., the element is one or more elements selected from phosphorus (P), arsenic (As), antimony (Sb), boron (B), aluminum (Al), tungsten (W), molybdenum (Mo), nitrogen (N), fluorine (F), chlorine (Cl), titanium (Ti), carbon (C), and zinc (Zn)).

Further, an oxygen vacancy causes generation of a carrier in the oxide semiconductor. Thus, the impurity regions 403a and 403b to which the impurity element for causing an oxygen vacancy in the oxide semiconductor is introduced have lower resistance than the channel formation region 403c and function as a source region and a drain region of the transistor. With the impurity regions 403a and 403b, resistance of a source or a drain of the transistor 420 can be lowered.

Further, since the thickness of the region 100 adjacent to the side surface of the gate electrode layer 401 is larger than that of the other region in the insulating layer 412a, the impurity element 431 is less likely to be introduced to a region 102 in the oxide semiconductor layer 403, which overlaps with the region 100. On the other hand, the impurity element 431 is contained in the region 100 of the insulating layer 412a. Thus, the region 102 contains the impurity element at a lower concentration than a region 104 which is included in the impurity region 403a or 403b and does not overlap with the gate electrode layer 401 or the region 100. Alternatively, the region 102 becomes a so-called offset region where the impurity element is not introduced, in some cases, depending on the conditions of introducing the impurity element.

In either case, in the oxide semiconductor layer 403 which has been subjected to introduction of the impurity element, the region 102 overlapping with the region 100 of the insulating layer 412a has a lower concentration of the contained impurity element than the region 104 which does not overlap with the gate electrode layer 401 or the region 100. When a region which has a low impurity concentration or contains no impurity element is provided to be adjacent to the channel formation region 403c, the electric-field concentration between the source and the drain is relieved, so that hot-carrier degradation can be suppressed. Therefore, the reliability of the transistor 420 can be improved.

Further, by introduction of the impurity element 431 through the insulating layer 412a having a difference in thickness, unintended entry of the impurity element 431 into the channel formation region 403c can be suppressed. Thus, generation of oxygen vacancies in the channel formation region 403c can be prevented, and the reliability of the transistor 420 can be improved accordingly. The treatment of introducing the impurity element 431 through the insulating layer 412a having a difference in thickness is particularly effective in a case where the transistor is miniaturized to have as short channel length.

Note that depending on the condition of introducing the impurity element 431, the impurity element may be contained in the base insulating layer 436 and/or the gate insulating layer 402, which overlap(s) with the region 104 in the oxide semiconductor layer 403. Also in a part of the gate insulating layer 402, which overlaps with the region 102 in the oxide semiconductor layer 403, the impurity element may be contained. In other words, the base insulating layer 436 and/or the gate insulating layer 402 in the transistor 420 may also contain the impurity element 431 and have a variation in concentration. For example, in the case where the impurity element 431 may be introduced so that the region 104 in the oxide semiconductor layer 403 has a peak of the concentration profile, the impurity element 431 is introduced also to parts of the base insulating layer 436 and the gate insulating layer 402, which overlap with the region 104. In that case, the parts of the base insulating layer 436 and the gate insulating layer 402 have higher concentrations of the impurity element than parts of the base insulating layer 436 and the gate insulating layer 402, which overlap with the region 102.

Further, in the vicinity of the boundary between the region 104 and the region 102, a peak of the concentration profile of the contained impurity element in the depth direction (thickness direction) is positioned at a shallower portion as a measured portion is close to the region 102. Note that the concentration profile in the depth direction, of the impurity element contained in each region of the oxide semiconductor layer 403 which has been subjected to introduction of the impurity element 431, can be obtained with secondary ion mass spectrometry (SIMS) or the like.

Figure 3A:
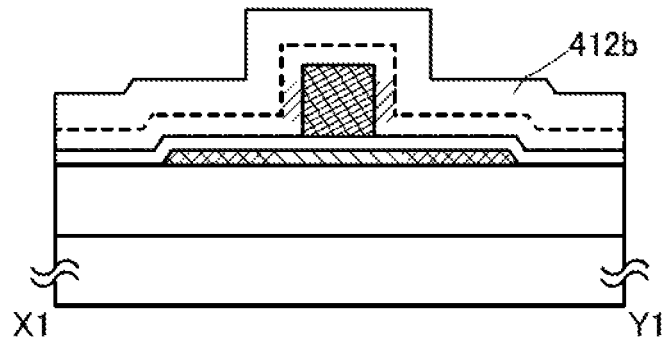
FIGS. 3A to 3C are cross-sectional views illustrating an example of a method for manufacturing a semiconductor device.

Next, an insulating layer 412b is formed over the insulating layer 412a (see FIG. 3A). The thickness of the insulating layer 412b is larger than at least that of the insulating layer 412a and is preferably greater than or equal to 200 nm and less than or equal to 500 nm. The insulating layer 412b can be formed using a material and method similar to those of the insulating layer 412a, which are selected as appropriate. The same material as that of the insulating layer 412a is preferably used.

In this embodiment, the insulating layer 412b is formed using a silicon oxide film by a plasma CVD method, as in the case of the insulating layer 412a. Note that in the case where the insulating layer 412b is formed using the same material as that of the insulating layer 412a, the interface between the insulating layer 412a and the insulating layer 412b is unclear in some cases. In FIG. 3A, an unclear interface is schematically illustrated by a dotted line. However, in the other process views and cross-sectional views of transistors in this specification, the interface is not shown. Note that the sentence "the interface is unclear" refers to a case where a continuous boundary is not observed in a cross-section observation (TEM image) with use of a high resolution transmission electron microscope.

The insulating layer 412a and the insulating layer 412b are insulating layers that are to be a sidewall insulating layer by being stacked and anisotropically etched. The insulating layer 412b with a large thickness is stacked after the impurity is introduced, whereby a thickness or a shape of the sidewall insulating layer can be adjusted so that the stacked structure of the insulating layer 412a and the insulating layer 412b can function as a sidewall insulating layer.

Figure 3B:
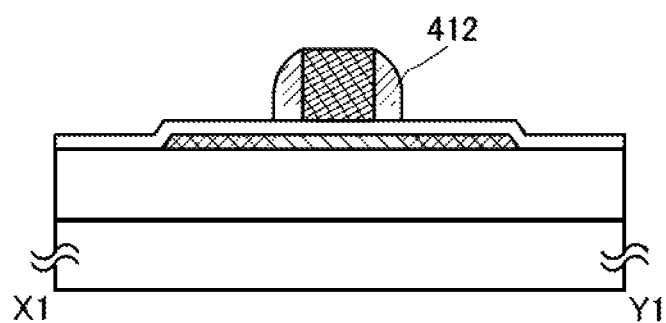
Figure 3C:
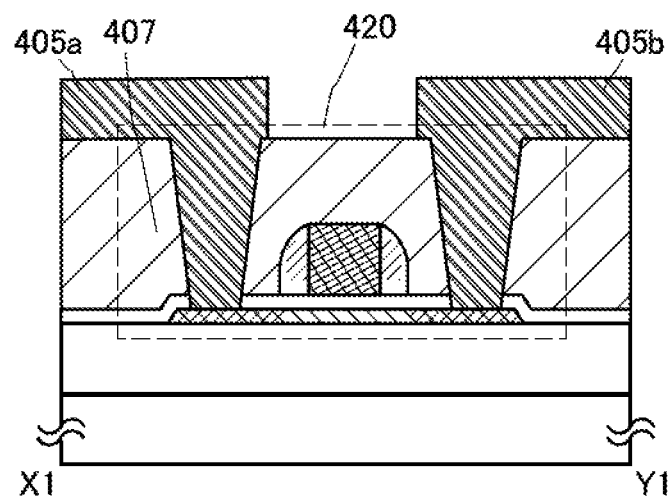

Then, the insulating layer 412a and the insulating layer 412b are subjected to anisotropic etching, so that the sidewall insulating layer 412 is formed on the side surface of the gate electrode layer 401 (see FIG. 3B). Since the sidewall insulating layer 412 includes the region 100 of the insulating layer 412a, the sidewall insulating layer 412 contains the impurity element 431.

Next, the insulating layer 407 is formed over gate insulating layer 402, the sidewall insulating layer 412, and the gate electrode layer 401, and openings is formed in the insulating layer 407. Then, the source electrode layer 405a and the drain electrode layer 405b are formed to be electrically connected to the oxide semiconductor layer 403 through the openings (see FIG. 3C).

The insulating layer 407 can be formed using an inorganic insulating film such as a silicon oxide film, a silicon oxynitride film, an aluminum oxide film, an aluminum oxynitride film, a gallium oxide film, a hafnium oxide film, a magnesium oxide film, a zirconium oxide film, a lanthanum oxide film, or a barium oxide film to have a single-layer structure or a stacked structure by a plasma CVD method, a sputtering method, an evaporation method, or the like. Alternatively, a planarization insulating film may be formed as the insulating layer 407 to reduce surface unevenness due to the transistor, or the inorganic insulating film and the planarization insulating film may be stacked. For the planarization insulating film, an organic material such as a polyimide-based resin, an acrylic-based resin, or a benzocyclobutene-based resin can be used. Besides the above organic materials, a low-dielectric constant material (a low-k material) or the like can be used.

As a conductive film used for the source electrode layer 405a and the drain electrode layer 405b, for example, a metal film containing an element selected from Al, Cr, Cu, Ta, Ti, Mo, or W, or a metal nitride film containing any of the above elements as a component (e.g., a titanium nitride film, a molybdenum nitride film, or a tungsten nitride film) can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Further alternatively, the conductive film used for the source electrode layer 405a and the drain electrode layer 405b may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$), an indium oxide-zinc oxide alloy ($In_2O_3$—ZnO), or any of these metal oxide materials in which silicon oxide is contained can be used.

For example, as the source electrode layer 405a and the drain electrode layer 405b, a single layer of a molybdenum film, a stack of a tantalum nitride film and a copper film, a stack of a tantalum nitride film and a tungsten film, or the like can be used.

The source electrode layer 405a and the drain electrode layer 405b are in contact with the impurity region 403a and the impurity region 403b in the oxide semiconductor layer 403, respectively. With a structure where the source electrode layer 405a and the drain electrode layer 405b are in contact with the low resistance regions (the impurity region 403a and the impurity region 403b), the contact resistance between the oxide semiconductor layer 403 and the source electrode layer 405a and the drain electrode layer 405b can be reduced.

Through the above steps, a semiconductor device including the transistor 420 of this embodiment can be manufactured.

In the method for manufacturing a semiconductor device described in this embodiment, an impurity element causing an oxygen vacancy is introduced to the oxide semiconductor layer 403 through the insulating layer 412a covering the gate electrode layer 401 over the oxide semiconductor layer 403 to form a pair of impurity regions which contains the impurity element and is in contact with a channel formation region of the oxide semiconductor layer. In the insulating layer 412a covering the gate electrode layer 401, the thickness of a region in contact with a side surface of the gate electrode layer 401 is larger than that of the other region; thus, the impurity element is less likely to be introduced into a portion of the oxide semiconductor layer 403, which overlaps with the large-thickness region.

By application of the manufacturing method described in this embodiment, a pair of low resistance regions between which a channel formation region is sandwiched can be formed while entry of an impurity element to the channel formation region is effectively suppressed, so that resistance of a source or a drain can be reduced. Further, the source electrode layer and the drain electrode layer are in contact with regions containing the impurity element (impurity regions), whereby the contact resistance can be reduced. Thus, the parasitic resistance can be reduced in the transistor 420, and accordingly, a transistor with favorable on-state characteristics (e.g., on-state current) can be provided.

The methods and structures described in this embodiment can be combined as appropriate with any of methods and structures described in the other embodiments.

(Embodiment 2)

In this embodiment, a semiconductor device with a different structure from that of Embodiment 1 and a method for manufacturing the semiconductor device will be described with reference to FIGS. 4A to 4C and FIGS. 5A to 5D. The same portions as those in the above embodiment, portions having functions similar to those of the portions in the above embodiment, and steps similar to those in the above embodiment may be carried out as in the above embodiment, and repeated description is omitted. In addition, detailed description of the same portion is not repeated.

Figure 4A:
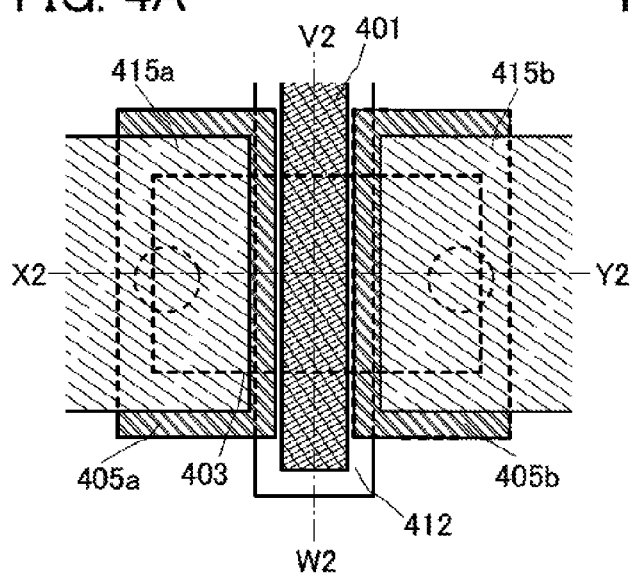
FIGS. 4A to 4C are a plan view and cross-sectional views illustrating one embodiment of a semiconductor device.
Figure 4C:
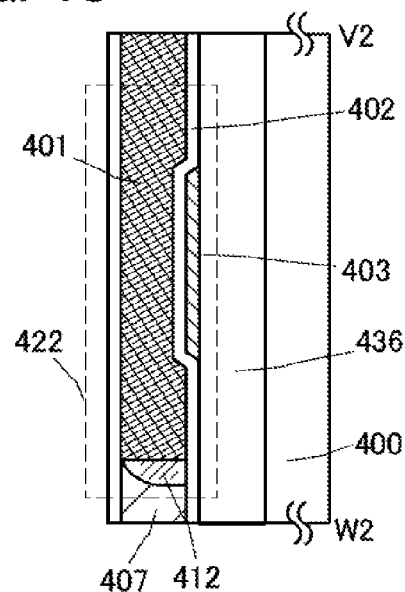
Figure 4B:
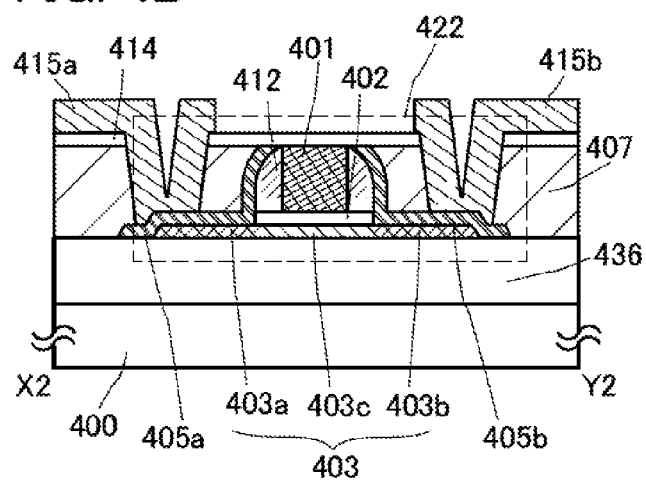
Figure 5A:
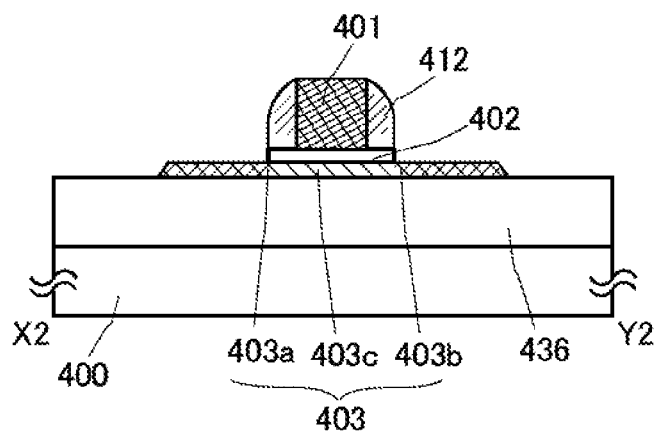
FIGS. 5A to 5D are cross-sectional views illustrating an example of a method for manufacturing a semiconductor device.
Figure 5B:
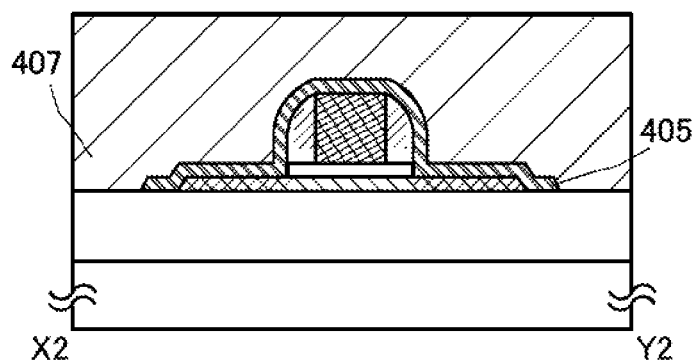
Figure 5C:
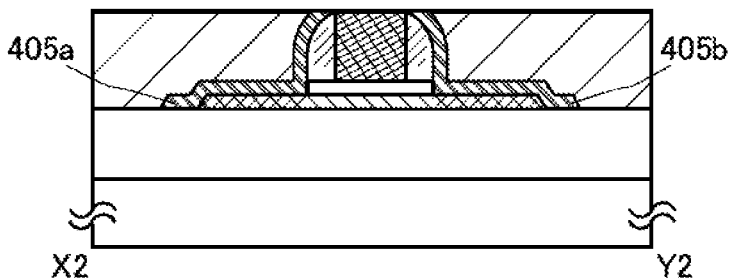
Figure 5D:
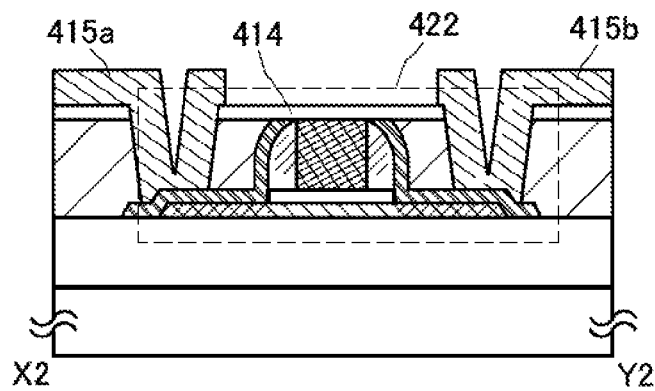

FIGS. 4A to 4C illustrate a structure example of a transistor 422. FIG. 4A is a plan view of the transistor 422, FIG. 4B is a cross-sectional view taken along line X2-Y2 in FIG. 4A, and FIG. 4C is a cross-sectional view taken along line V2-W2 in FIG. 4A. Note that in FIG. 4A, some components of the transistor 422 (e.g., an insulating layer 414 and the like) are not illustrated to avoid complexity.

The transistor 422 illustrated in FIGS. 4A to 4C includes the following components over the substrate 400: the oxide semiconductor layer 403 which includes the pair of impurity regions 403a and 403b and the channel formation region 403c provided between the impurity region 403a and the impurity region 403b; the gate insulating layer 402 provided over the oxide semiconductor layer 403; the gate electrode layer 401 overlapping with the channel formation region 403c with the gate insulating layer 402 interposed therebetween; the sidewall insulating layer 412 in contact with a side surface of the gate electrode layer 401; and the source electrode layer 405a or the drain electrode layer 405b in contact with part of a surface of the oxide semiconductor layer 403 and side surfaces of the gate insulating layer 402 and the sidewall insulating layer 412.

In addition, the base insulating layer 436, the insulating layer 407, the insulating layer 414, a source wiring layer 415a, and a drain wiring layer 415b may be included as components of the transistor 422. The source wiring layer 415a is electrically connected to the source electrode layer 405a through an opening provided in the insulating layer 414 and the insulating layer 407. The drain wiring layer 415b is electrically connected to the drain electrode layer 405b through an opening provided in the insulating layer 414 and the insulating layer 407.

An example of a method for manufacturing the transistor 422 is described with reference to FIGS. 5A to 5D.

Through steps similar to those in FIGS. 2A to 2C and FIGS. 3A and 3B, the manufacturing process up to formation of the sidewall insulating layer 412 on the side surface of the gate electrode layer 401 over the substrate 400 is performed. After that, the gate insulating layer 402 is etched with use of the sidewall insulating layer 412 as a mask, so that parts of the oxide semiconductor layer 403 (the impurity region 403a and the impurity region 403b) are exposed (see FIG. 5A).

Next, a conductive film is formed to cover the exposed oxide semiconductor layer 403, the sidewall insulating layer 412, and the gate electrode layer 401 and then etched selectively with use of a resist mask formed through a photolithography step, so that a conductive film 405 is formed. At this step, the conductive film 405 has a region overlapping with the gate electrode layer 401. Then, the insulating layer 407 is formed over the conductive film 405 (see FIG. 5B).

The conductive film 405 can be formed using a material similar to that of the source electrode layer 405a and the drain electrode layer 405b described in Embodiment 1.

Note that introduction of an impurity element to the oxide semiconductor layer 403 is performed at least once through the insulating layer 412a covering the gate electrode layer 401. In the process of manufacturing the transistor, the introduction of an impurity element may be performed plural times as long as it is performed after the gate electrode layer 401 is formed. For example, the impurity element 431 may be further introduced after the conductive film 405 is formed. By additional introduction of the impurity element after the formation of the conductive film 405, a variation in concentration of the impurity element in the oxide semiconductor layer 403 may be further increased.

Next, the insulating layer 407 and the conductive film 405 are subjected to polishing (cutting or grinding) treatment, whereby the region of the conductive film 405, which overlaps with the gate electrode layer 401 is removed. Thus, the source electrode layer 405a and the drain electrode layer 405b are formed. When the region of the conductive film 405, which overlaps with the gate electrode layer 401, is removed by polishing treatment, the conductive film 405 can be divided in the channel length direction without a resist mask. Thus, even in the case where the transistor 422 has a minute channel length, the source electrode layer 405a and the drain electrode layer 405b can be formed with high precision (see FIG. 5C).

For the polishing (cutting or grinding) treatment, chemical mechanical polishing (CMP) treatment can be preferably employed. In this embodiment, the region of the conductive film 405, which overlaps with the gate electrode layer 401, is removed by CMP treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, productivity and the flatness of the surfaces can be further increased.

Note that in this embodiment, the CMP treatment is used for removing the region of the conductive film 405, which overlap with the gate electrode layer 401; however, another polishing (grinding or cutting) treatment may be used. Alternatively, the polishing treatment such as CMP treatment may be combined with etching (dry etching or wet etching) treatment or plasma treatment. For example, after the CMP treatment, dry etching treatment or plasma treatment (e.g., reverse sputtering) may be performed in order to improve the flatness of a surface to be processed. In the case where the polishing treatment is combined with etching treatment, plasma treatment or the like, the order of the steps is not particularly limited, and may be set as appropriate depending on the material, thickness, and roughness of the surface of the conductive film 405.

Note that in this embodiment, the tops of the source electrode layer 405a and the drain electrode layer 405b are positioned at almost the same level as that of the gate electrode layer 401. Note that the shape of the source electrode layer 405a and the drain electrode layer 405b differs depending on the conditions of polishing treatment for removing part of the conductive film 405. For example, the source electrode layer 405a or the drain electrode layer 405b may be recessed in the thickness direction as compared to the surface of the gate electrode layer 401.

Then, the insulating layer 414 is formed over the insulating layer 407, and openings reaching the source electrode layer 405a and the drain electrode layer 405b are formed in the insulating layer 414 and the insulating layer 407. In the openings, the source wiring layer 415a which is electrically connected to the source electrode layer 405a and the drain wiring layer 415b which is electrically connected to the drain electrode layer 405b are formed (see FIG. 5D).

Through the above steps, a semiconductor device including the transistor 422 described in this embodiment can be manufactured.

In the transistor described in this embodiment, the distance between the gate electrode layer 401 and a region where the source electrode layer 405a is in contact with the oxide semiconductor layer 403 (contact region on the source side) can be made small, and the distance between the gate electrode layer 401 and a region where the drain electrode layer 405b is in contact with the oxide semiconductor layer 403 (contact region on the drain side) can be also made small. Thus, resistance between the gate electrode layer 401 and the contact region on the source or drain side can be reduced, and the on-characteristics can be improved.

In the transistor described in this embodiment, the sidewall insulating layer 412 serves to suppress formation of a parasitic channel between the gate electrode layer 401 and the source electrode layer 405a or the drain electrode layer 405b.

The methods and structures described in this embodiment can be combined as appropriate with any of the methods and structures described in the other embodiments.

(Embodiment 3)

In this embodiment, an example of a semiconductor device (memory device) which includes the transistor described in this specification, which can hold stored data even when not powered, and which has an unlimited number of write cycles will be described with reference to drawings.

Figure 6A:
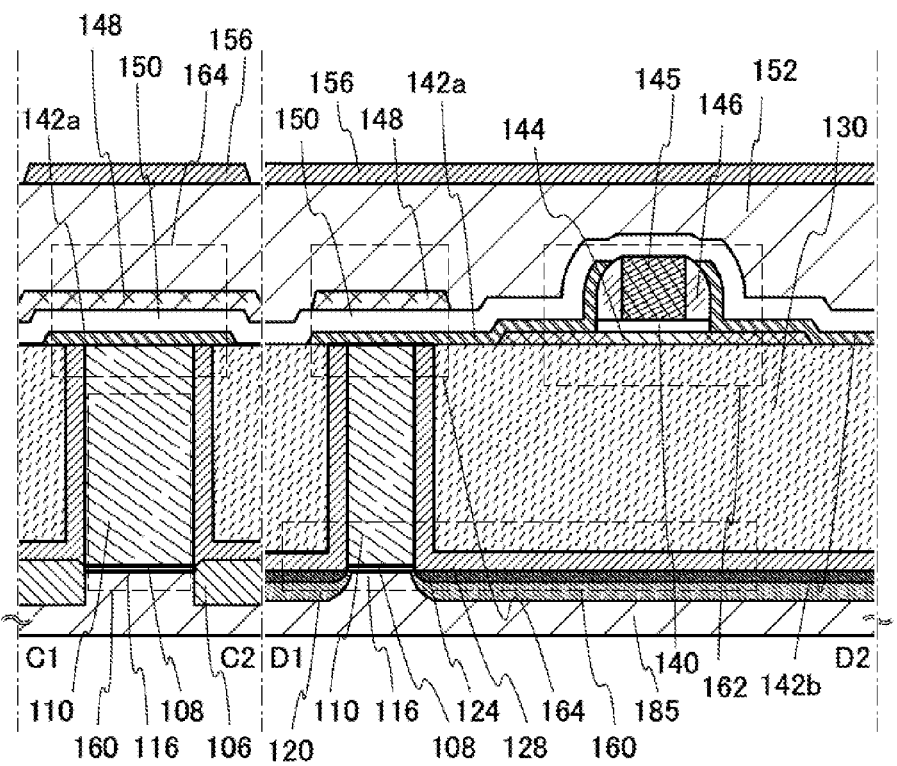
FIGS. 6A to 6C are a plan view, a cross-sectional view, and a circuit diagram illustrating one embodiment of a semiconductor device.
Figure 6B:
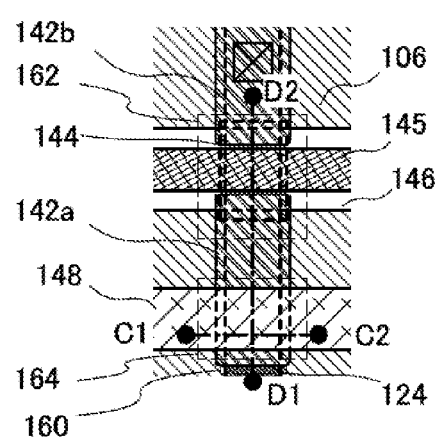
Figure 6C:
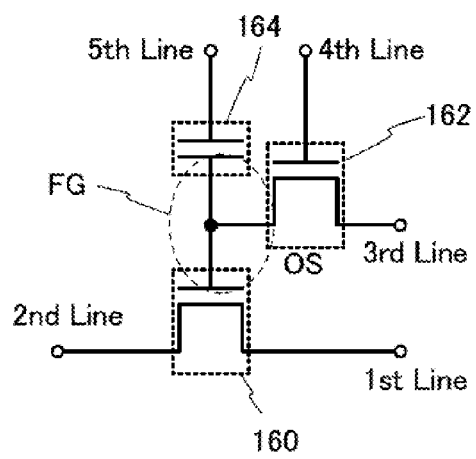

FIGS. 6A and 6B illustrate one example of a structure of the semiconductor device. FIG. 6A is a cross-sectional view of the semiconductor device, FIG. 6B is a plan view of the semiconductor device, and FIG. 6C is a circuit diagram of the semiconductor device. Here, FIG. 6A corresponds to cross sections taken along line C1-C2 and line D1-D2 in FIG. 6B.

The semiconductor device illustrated in FIGS. 6A and 6B includes a transistor 160 including a first semiconductor material in a lower portion, and a transistor 162 including a second semiconductor material in an upper portion. For the transistor 162, the structure of the transistor 422 shown in Embodiment 2 is employed as an example.

Here, the first semiconductor material and the second semiconductor material are preferably materials having different band gaps. For example, the first semiconductor material may be a semiconductor material (e.g., silicon) other than an oxide semiconductor and the second semiconductor material may be an oxide semiconductor. A transistor including a material other than an oxide semiconductor can operate at high speed easily. On the other hand, a transistor including an oxide semiconductor enables holding of charge for or a long time owing to its characteristics.

Although all the above transistors are n-channel transistors here, it is needless to say that p-channel transistors can be used. The specific structure of the semiconductor device, such as the material used for the semiconductor device and the component of the semiconductor device, is not necessarily limited to those described here except for the use of the transistor described in Embodiment 1 or 2, which is formed using an oxide semiconductor to hold data.

The transistor 160 in FIG. 6A includes a channel formation region 116 provided in a substrate 185 containing a semiconductor material (e.g., silicon), impurity element regions 120 provided so that the channel formation region 116 is sandwiched therebetween, intermetallic compound regions 124 in contact with the impurity element regions 120, a gate insulating layer 108 provided over the channel formation region 116, and a gate electrode layer 110 provided over the gate insulating layer 108. Note that a transistor whose source electrode layer and drain electrode layer are not illustrated in a drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer.

An element isolation insulating layer 106 is provided over the substrate 185 to surround the transistor 160. An insulating layer 128 and an insulating layer 130 are provided to cover the transistor 160.

The transistor 160 formed using a single crystal semiconductor substrate can operate at high speed. Thus, when the transistor is used as a reading transistor, data can be read at a high speed. As treatment prior to formation of the transistor 162 and a capacitor 164, CMP treatment is performed on the insulating layer covering the transistor 160, whereby the insulating layer 128 and the insulating layer 130 are planarized and, at the same time, an upper surface of the gate electrode layer of the transistor 160 is exposed.

The transistor 162 illustrated in FIG. 6A is a top-gate transistor in which an oxide semiconductor is used for a channel formation region. Here, an oxide semiconductor layer 144 in the transistor 162 is highly purified and an intrinsic (i-type) oxide semiconductor in which entry of an impurity element to a channel formation region is suppressed. Thus, the transistor 162 has excellent off-state characteristics. Furthermore, in the transistor 162 in this embodiment, a sidewall insulating layer 146 can serve to suppress generation of a parasitic channel between a gate electrode layer 145 and an electrode layer 142a or 142b.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

An insulating layer 150 having a single-layer structure or a stacked structure is provided over the transistor 162. In addition, a conductive layer 148 is provided in a region overlapping with the electrode layer 142a of the transistor 162 with the insulating layer 150 interposed therebetween, and the electrode layer 142a, the insulating layer 150, and the conductive layer 148 form a capacitor 164. That is, the electrode layer 142a of the transistor 162 also functions as one electrode of the capacitor 164, and the conductive layer 148 functions as the other electrode of the capacitor 164. Note that the capacitor 164 may be omitted if a capacitor is not needed. Alternatively, the capacitor 164 may be independently provided above the transistor 162.

An insulating layer 152 is provided over the transistor 162 and the capacitor 164. Over the insulating layer 152, a wiring 156 is provided. The wiring 156 connects the transistor 162 with another transistor. Although not illustrated in FIG. 6A, the wiring 156 is electrically connected to the electrode layer 142b through an electrode formed in an opening provided in the insulating layer 150, the insulating layer 152, and the like.

In FIGS. 6A and 6B, the transistor 160 and the transistor 162 partly overlap with each other; it is preferable that a source region or a drain region of the transistor 160 overlap with part of the oxide semiconductor layer 144. Further, the transistor 162 and the capacitor 164 are provided so as to overlap with at least part of the transistor 160. For example, the conductive layer 148 included in the capacitor 164 is provided so as to overlap with the gate electrode layer 110 of the transistor 160 at least partly. With such a planar layout, the area occupied by the semiconductor device can be reduced; thus, higher integration can be achieved.

Next, an example of a circuit configuration corresponding to FIGS. 6A and 6B is illustrated in FIG. 6C.

In FIG. 6C, a first wiring (1st Line) is electrically connected to the source electrode layer of the transistor 160. A second wiring (2nd Line) is electrically connected to the drain electrode layer of the transistor 160. A third wiring (3rd Line) is electrically connected to one of a source electrode layer and a drain electrode layer of the transistor 162, and a fourth wiring (4th Line) is electrically connected to a gate electrode layer of the transistor 162. The gate electrode layer of the transistor 160 and the other of the source electrode layer and the drain electrode layer of the transistor 162 are electrically connected to one electrode of the capacitor 164. A fifth wiring (5th line) and the other electrode of the capacitor 164 are electrically connected to each other.

The semiconductor device illustrated in FIG. 6C utilizes a characteristic in which the potential of the gate electrode layer of the transistor 160 can be held, and thus enables data writing, holding, and reading as follows.

Writing and holding of data will be described. First, the potential of the fourth line is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, one of two kinds of charges providing different potential levels (hereinafter referred to as low-level charge and high-level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the amount of off-state current of the transistor 162 is extremely small, the charge of the gate electrode layer of the transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 160. This is because in general, when the transistor 160 is an n-channel transistor, an apparent threshold voltage $V_{th\_H}$ in the case where the high-level charge is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth line, which is needed to turn on the transistor 160. Thus, the potential of the fifth wiring is set to a potential $V_0$ that is between $V_{th\_H}$ and $V_{th\_L}$, whereby charge supplied to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case where data is not read out, a potential at which the transistor 160 is off regardless of the state of the gate electrode layer of the transistor 160, that is, a potential smaller than $V_{th\_H}$ may be given to the fifth wiring. Alternatively, a potential which allows the transistor 160 to be on regardless of a state of the gate electrode layer, that is, a potential higher than $V_{th\_L}$ may be given to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

As described above, a miniaturized and highly-integrated semiconductor device having high electric characteristics and a method for manufacturing the semiconductor device can be provided.

The methods and structures described in this embodiment can be combined as appropriate with any of the methods and structures described in the other embodiments.

(Embodiment 4)

In this embodiment, one embodiment of a structure of a memory device which is different from that in Embodiment 3 will be described.

Figure 7:
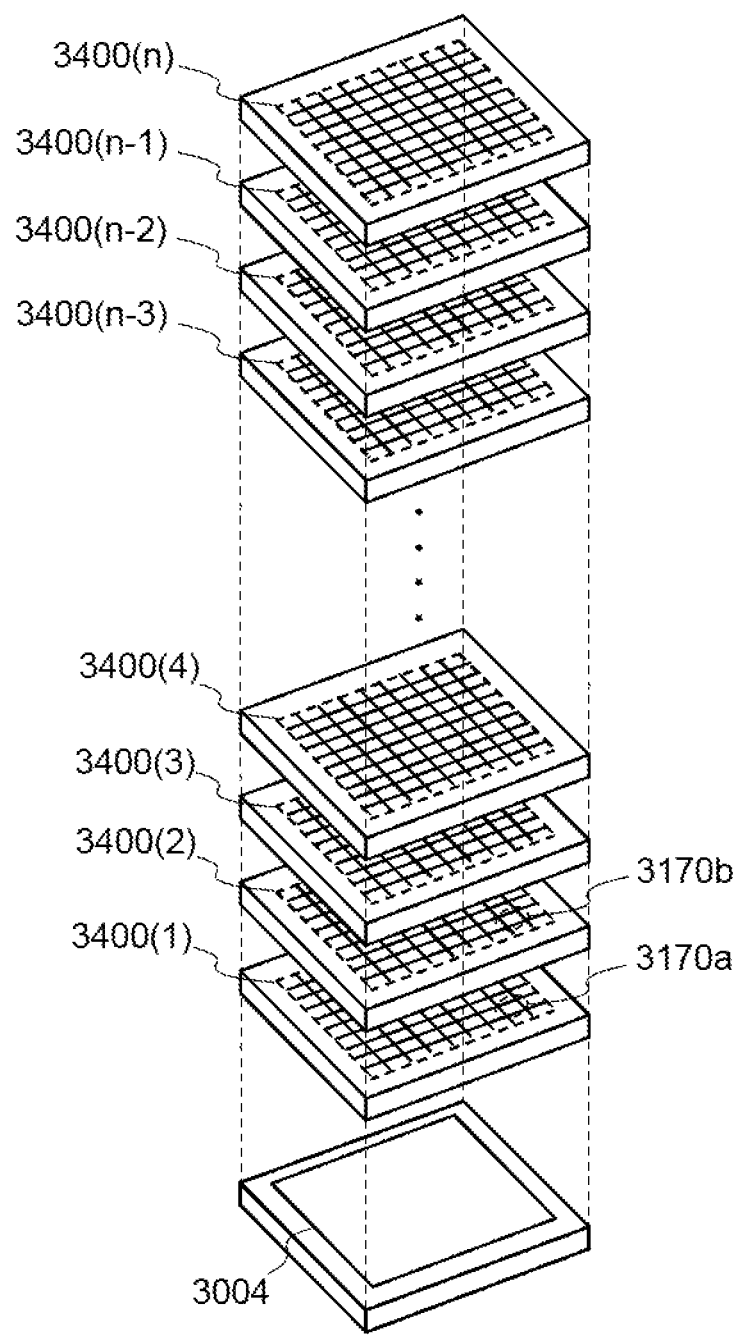
FIG. 7 is a perspective view illustrating one embodiment of a semiconductor device.

FIG. 7 is a perspective view of a memory device. The memory device illustrated in FIG. 7 includes a plurality of layers of memory cell arrays (memory cell arrays 3400(1) to 3400(n) (n is an integer greater than or equal to 2)) each including a plurality of memory cells as memory circuits in the upper portion, and a logic circuit 3004 in the lower portion which is necessary for operating the memory cell arrays 3400(1) to 3400(n).

Figure 8:
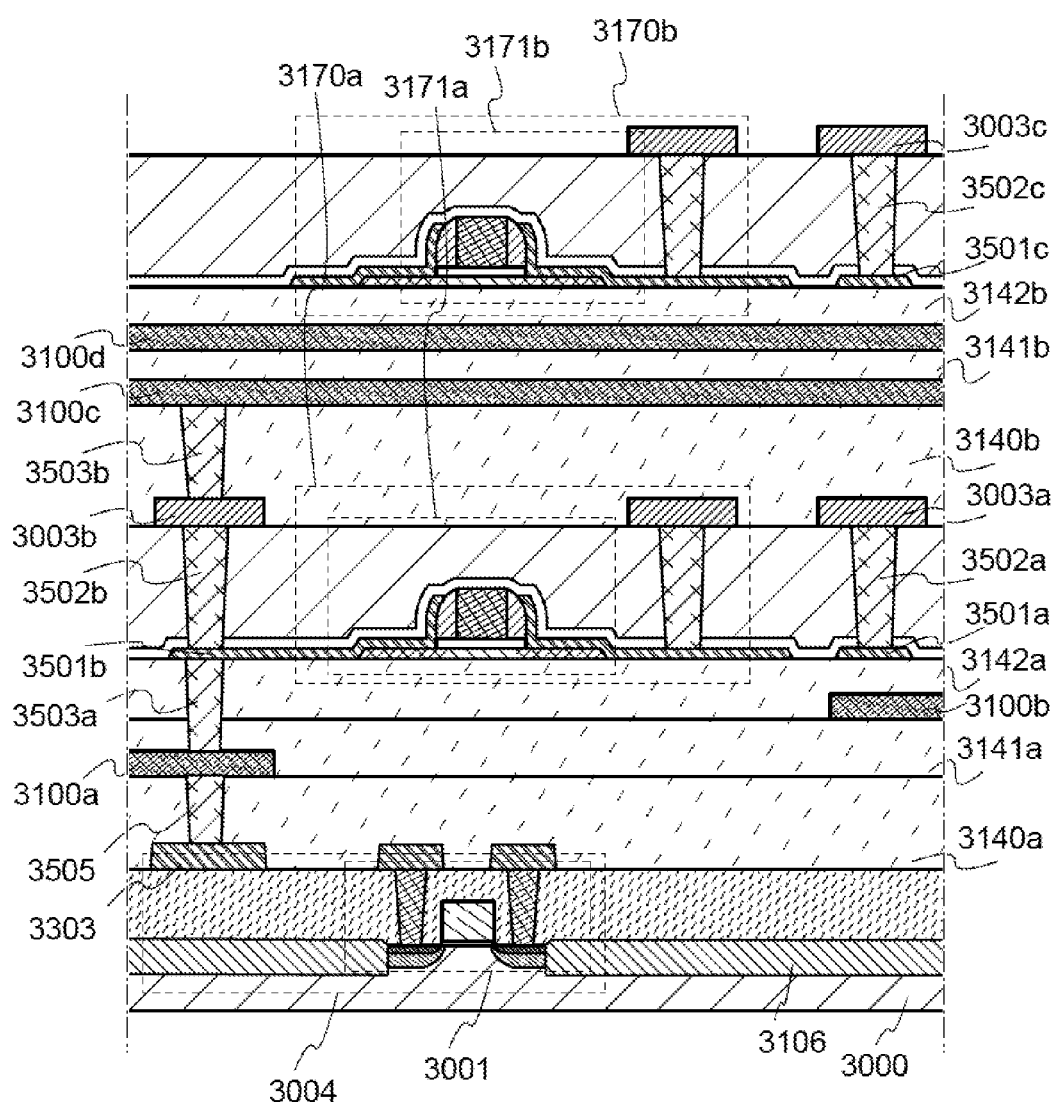
FIG. 8 is a cross-sectional view illustrating one embodiment of a semiconductor device.

FIG. 8 illustrates the logic circuit 3004, the memory cell array 3400(1), and the memory cell array 3400(2), in which a memory cell 3170a and a memory cell 3170b are illustrated as typical examples among the plurality of memory cells included in the memory cell array 3400(1) and the memory cell array 3400(2). The memory cell 3170a and the memory cell 3170b can have a configuration similar to the circuit configuration described in the above embodiment, for example.

Note that a transistor 3171a included in the memory cell 3170a is illustrated in FIG. 8 as a typical example. A transistor 3171b included in the memory cell 3170b is illustrated as a typical example. In the transistor 3171a and the transistor 3171b, a channel formation region is formed in an oxide semiconductor layer. The structure of the transistor in which the channel formation region is formed in the oxide semiconductor layer is the same as the structure described in Embodiment 1 or 2, and thus the description of the structure is omitted.

An electrode layer 3501a which is formed in the same layer as a source electrode layer and a drain electrode layer of the transistor 3171a is electrically connected to an electrode layer 3003a via an electrode layer 3502a. An electrode layer 3501c which is formed in the same layer as source and drain electrode layers of the transistor 3171b is electrically connected to an electrode layer 3003c through an electrode layer 3502c.

The logic circuit 3004 includes a transistor 3001 in which a semiconductor material other than an oxide semiconductor is used as a channel formation region. The transistor 3001 can be a transistor obtained in such a manner that an element isolation insulating layer 3106 is provided on a substrate 3000 including a semiconductor material (e.g., silicon) and a region serving as a channel formation region is formed in a region surrounded by the element isolation insulating layer 3106. Note that the transistor 3001 may be a transistor obtained in such a manner that the channel formation region is formed in a semiconductor film such as a polycrystalline silicon film formed on an insulating surface or in a silicon film of an SOI substrate. Description of the transistor 3001 is omitted because a known structure can be used.

A wiring 3100a and a wiring 3100b are formed between layers in which the transistor 3171a is formed and layers in which the transistor 3001 is formed. An insulating layer 3140a is provided between the wiring 3100a and the layers in which the transistor 3001 is formed. An insulating layer 3141a is provided between the wiring 3100a and the wiring 3100b. An insulating layer 3142a is provided between the wiring 3100b and the layers in which the transistor 3171a is formed.

Similarly, a wiring 3100c and a wiring 3100d are formed between the layers in which the transistor 3171b is formed and the layers in which the transistor 3171a is formed. An insulating layer 3140b is provided between the wiring 3100c and the layers in which the transistor 3171a is formed. An insulating layer 3141b is provided between the wiring 3100c and the wiring 3100d. An insulating layer 3142b is provided between the wiring 3100d and the layers in which the transistor 3171b is formed.

The insulating layers 3140a, 3141a, 3142a, 3140b, 3141b, and 3142b each function as an interlayer insulating layer whose surface can be planarized.

The wirings 3100a, 3100b, 3100c, and 3100d enable electrical connection between the memory cells, electrical connection between the logic circuit 3004 and the memory cells, and the like.

An electrode layer 3303 included in the logic circuit 3004 can be electrically connected to a circuit provided in the upper portion.

For example, as illustrated in FIG. 8, the electrode layer 3303 can be electrically connected to the wiring 3100a via an electrode layer 3505. The wiring 3100a can be electrically connected to an electrode layer 3501b of the transistor 3171a via an electrode layer 3503a. In this manner, the wiring 3100a and the electrode layer 3303 can be electrically connected to the source or the drain of the transistor 3171a. The electrode layer 3501b which is the source or the drain of the transistor 3171a can be electrically connected to an electrode layer 3003b via an electrode layer 3502b. The electrode layer 3003b can be electrically connected to the wiring 3100c via an electrode layer 3503b.

FIG. 8 illustrates the structure in which the electrode layer 3303 and the transistor 3171a are electrically connected to each other via the wiring 3100a; however, one embodiment of the disclosed invention is not limited thereto. The electrode layer 3303 may be electrically connected to the transistor 3171a via the wiring 3100b or both the wiring 3100b and the wiring 3100a. Alternatively, the electrode layer 3303 may be electrically connected to the transistor 3171a via another electrode layer without the wiring 3100a or the wiring 3100b.

FIG. 8 illustrates the structure in which two wiring layers, i.e., a wiring layer including the wiring 3100a and a wiring layer including the wiring 3100b are provided between the layer including the transistor 3171a and the layer including the transistor 3001; however, the number of wiring layers provided therebetween is not limited to two. One wiring layer or three or more wiring layers may be provided between the layer including the transistor 3171a and the layer including the transistor 3001.

Furthermore, FIG. 8 illustrates the structure in which two wiring layers, i.e., a wiring layer including the wiring 3100c and a wiring layer including the wiring 3100d are provided between the layer including the transistor 3171b and the layer including the transistor 3171a; however, the number of wiring layers provided therebetween is not limited to two. One wiring layer or three or more wiring layers may be provided between the layer including the transistor 3171b and the layer including the transistor 3171a.

The methods and structures described in this embodiment can be combined as appropriate with any of the methods and structures described in the other embodiments.

(Embodiment 5)

In this embodiment, a central processing unit (CPU) at least part of which includes any of the transistors disclosed in Embodiments 1 and 2 will be described as an example of a semiconductor device.

Figure 9A:
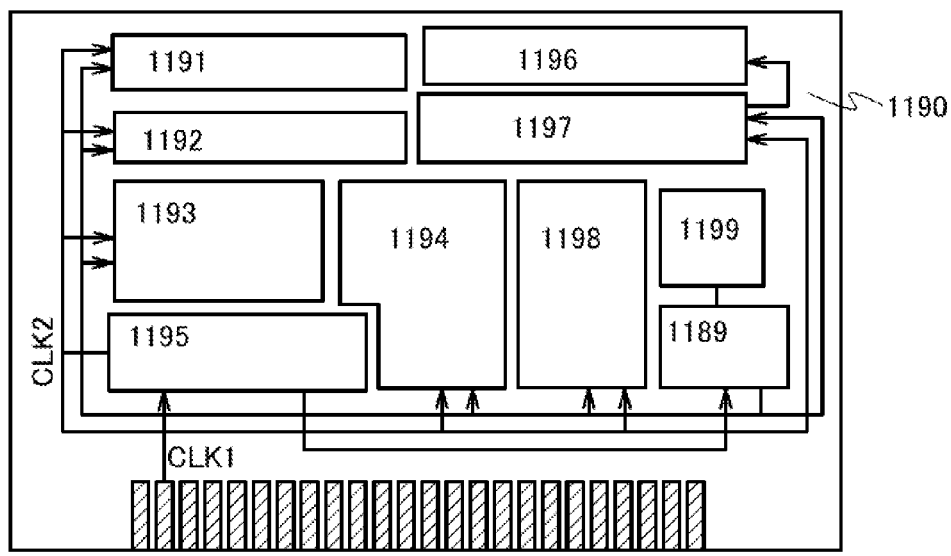
FIGS. 9A to 9C are a block diagram illustrating one embodiment of a semiconductor device and partial circuit diagrams of the block diagram.

FIG. 9A is a block diagram illustrating a specific structure of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189, over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 9A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 9A, a memory cell is provided in the register 1196. The memory cell disclosed in Embodiment 3 or 4 can be used as the memory cell in the register 1196.

In the CPU illustrated in FIG. 9A, the register controller 1197 selects operation of holding data in the register 1196 in accordance with an instruction from the ALU 1191. That is, the register controller 1197 determines whether data is held by a logic element reversing the logic (value) or by a capacitor in the memory cell included in the register 1196. When data holding by the phase-inversion element is selected, power supply voltage is supplied to the memory cell in the register 1196. When data holding by the capacitor is selected, the data is rewritten in the capacitor, and supply of power supply voltage to the memory cell in the register 1196 can be stopped.

Figure 9B:
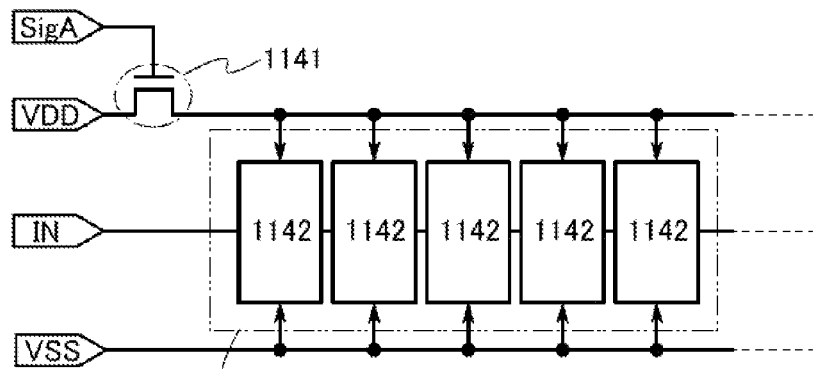
Figure 9C:
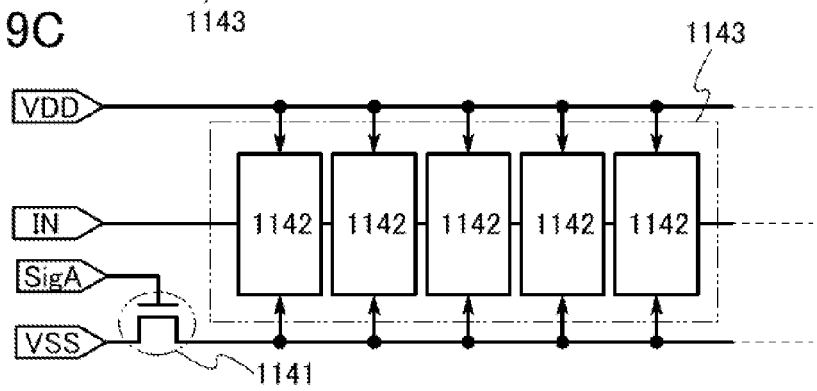

The power supply can be stopped by providing a switching element between a memory cell group and a node to which a power supply potential VDD or a power supply potential VSS is supplied, as illustrated in FIG. 9B or FIG. 9C. Circuits illustrated in FIGS. 9B and 9C will be described below.

FIGS. 9B and 9C each illustrate an example of a structure of a memory circuit in which any of the transistors disclosed in Embodiments 1 and 2 is used as a switching element for controlling supply of a power supply potential to a memory cell.

The memory device illustrated in FIG. 9B includes a switching element 1141 and a memory cell group 1143 including a plurality of memory cells 1142. Specifically, as each of the memory cells 1142, the memory cell described in Embodiment 3 or 4 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 9B, any of the transistors described in Embodiments 1 and 2 is used as the switching element 1141, and the switching of the transistor is controlled by a signal Sig A supplied to a gate electrode layer thereof.

Note that FIG. 9B illustrates the structure in which the switching element 1141 includes only one transistor; however, the structure is not limited thereto, and the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 9B, the switching element 1141 may control the supply of the low-level power supply potential VSS.

In FIG. 9C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The methods and structures described in this embodiment can be combined as appropriate with any of the methods and structures described in the other embodiments.

Further, Table 1 shows a comparison between a spin-MRAM (spin-transfer torque MRAM) which is known as a spintronics device and a memory including an oxide semiconductor.

TABLE 1

|  | Spintronics (magnetic) | Oxide semiconductor/Si |
|---|---|---|
| 1) Heat resistance | Unstable | Extremely stable (up to 150° C.) |
| 2) Driving method | Current drive | Voltage drive |
| 3) Principle of writing operation | Change Spin Direction of Magnetic Substance | On/off of FET |
| 4) Si LSI | Suitable for bipolar LSI (MOS transistor is preferred in high integration circuit (Bipolar transistor is unsuitable for High Integration); W is large) | Suitable for MOS LSI |
| 5) Power for Overhead | High | Charge and discharge of parasitic capacitance |
|  | Joule heat is needed | Smaller by 2 or 3 or more orders of magnitude |
| 6) Non-volatility | Utilizing Spin | Utilizing small off-state current |
| 7) Number of times of reading operation | Unlimited | Unlimited |
| 8) 3D conversion | Difficult (2 layers at most) | Easy (No limitation on the number of layers) |
| 9) Degree of integration ($F^2$) | $15F^2$ | Depending on the degree of 3D conversion |
| 10) Material | Rare earth magnetic material | Oxide semiconductor material |
| 11) Resistance to magnetic field | Low | High |

As shown in Table 1, the memory in which a transistor including an oxide semiconductor and a transistor including silicon are combined is significantly different from the spintronics device in the driving method, the principle of writing operation, the material, and the like.

Further, as shown in Table 1, the memory in which the transistor including an oxide semiconductor and the transistor including silicon are combined has advantages over the spintronics device in many aspects such as the heat resistance, the 3D conversion (stacked-layer structure of three or more layers), and the resistance to a magnetic field. Note that the "power for overhead" means a so-called power consumed by overhead, which is, for example, power for writing data into a memory portion or the like in a processor.

As described above, the use of the memory including an oxide semiconductor, which has more advantages than the spintronics device, makes it possible to reduce power consumption of a CPU.

The methods and structures described in this embodiment can be combined as appropriate with any of the methods and structures described in the other embodiments.

(Embodiment 6)

A semiconductor device disclosed in this specification can be applied to a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 10A to 10C.

Figure 10A:
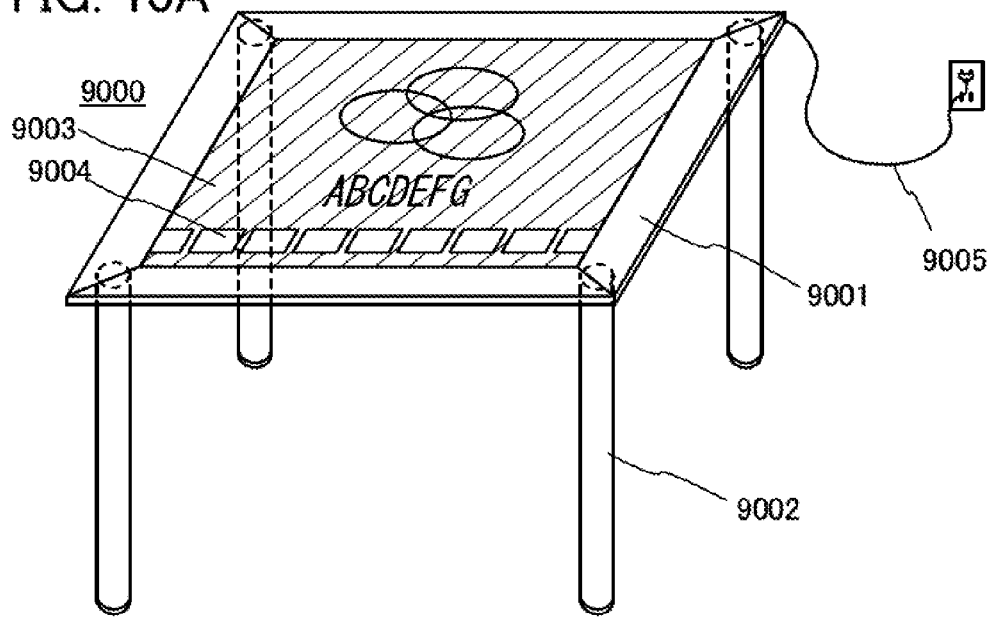
FIGS. 10A to 10C each illustrate an electronic device of the present invention.
Figure 10B:
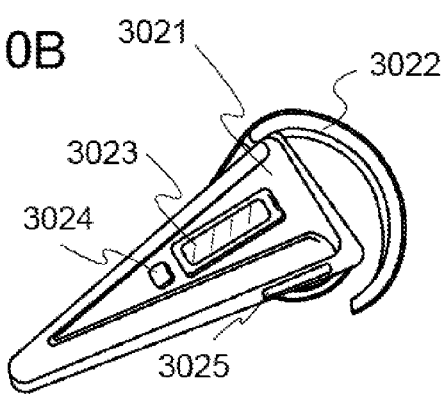
Figure 10C:
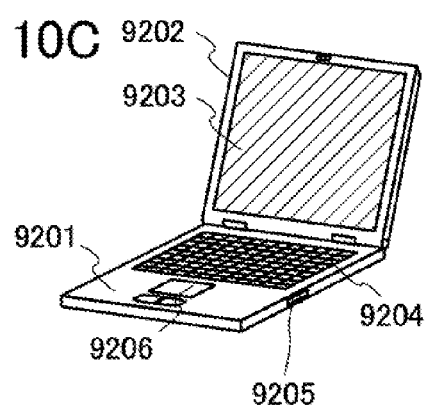

FIG. 10A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in any of Embodiments 1 and 2 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of data. Further, when the table may be made to communicate with home appliances or control the home appliances, the table 9000 may function as a control device which controls the home appliances by operation on the screen. For example, with use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 10B illustrates a portable music player, which includes, in a main body 3021, a display portion 3023, a fixing portion 3022 with which the portable music player can be worn on the ear, a speaker, an operation button 3024, an external memory slot 3025, and the like. The transistor described in any of Embodiment 1 and 2 or the memory described in Embodiment 3 or 4 is used in a memory or a CPU incorporated in the main body 3021, whereby a portable music player (PDA) in which power consumption can be further reduced can be provided.

Furthermore, when the portable music player illustrated in FIG. 10B has an antenna, a microphone function, or a wireless communication function and is used with a mobile phone, a user can talk on the phone wirelessly and hands-free while driving a car or the like.

FIG. 10C illustrates a computer which includes a main body 9201 including a CPU, a housing 9202, a display portion 9203, a keyboard 9204, an external connection port 9205, a pointing device 9206, and the like. The computer includes a semiconductor device manufactured according to one embodiment of the present invention for the display portion 9203. When the CPU described in Embodiment 5 is used, power consumption of the computer can be reduced.

Figure 11A:
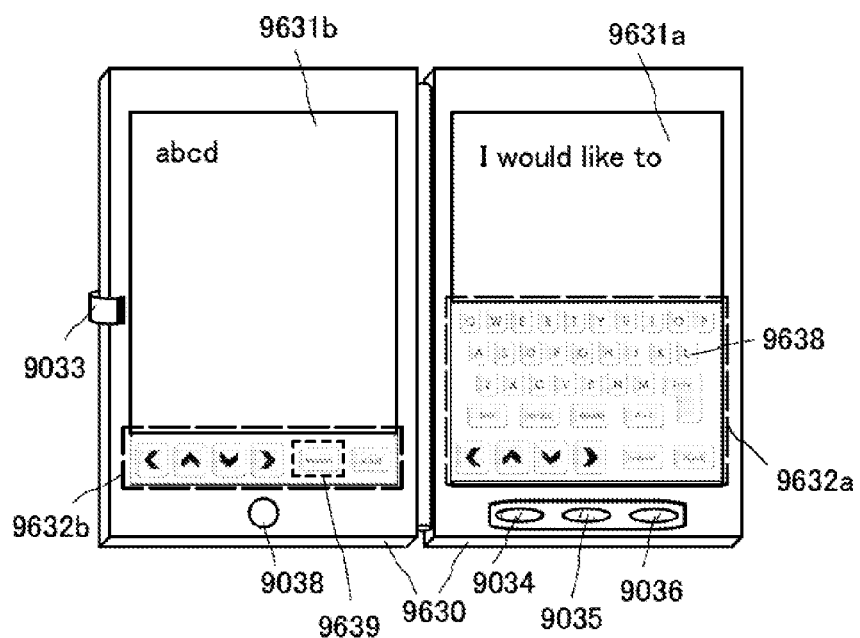
FIGS. 11A to 11C illustrate an electronic device of the present invention.
Figure 11B:
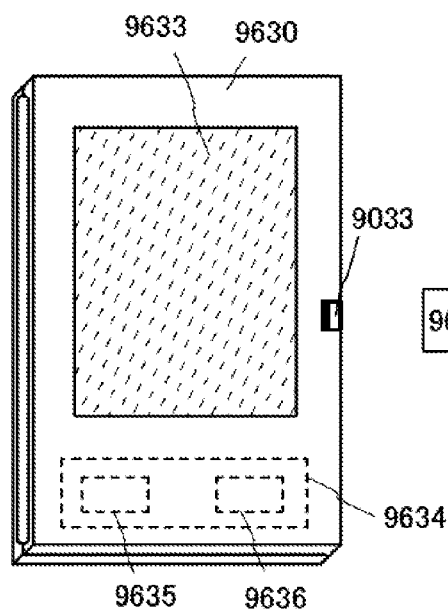

FIGS. 11A and 11B illustrate a tablet terminal that can be folded. In FIG. 11A, the tablet terminal is opened, and includes a housing 9630, a display portion 9631*a*, a display portion 9631*b*, a display-mode switching button 9034, a power button 9035, a power-saving-mode switching button 9036, a clip 9033, and an operation button 9038.

In such a portable device illustrated in FIGS. 11A and 11B, an SRAM or a DRAM is used as a memory element for temporarily storing image data. For example, the semiconductor device described in Embodiment 3 or 4 can be used as a memory element. When the semiconductor device described in the above embodiment is employed for the memory element, writing and reading of data can be performed at high speed, data can be retained for a long time, and power consumption can be sufficiently reduced.

A touch panel area 9632*a* can be provided in a part of the display portion 9631*a*, in which data can be input by touching displayed operation keys 9638. Note that FIG. 11A shows, as an example, that half of the area of the display portion 9631*a* has only a display function and the other half of the area has a touch panel function. However, the structure of the display portion 9631*a* is not limited to this, and all the area of the display portion 9631*a* may have a touch panel function. For example, all the area of the display portion 9631*a* can display keyboard buttons and serve as a touch panel while the display portion 9631*b* can be used as a display screen.

Like the display portion 9631*a*, part of the display portion 9631*b* can be a touch panel region 9632*b*. When a finger, a stylus, or the like touches the place where a button 9639 for switching to keyboard display is displayed in the touch panel, keyboard buttons can be displayed on the display portion 9631*b*.

Touch input can be performed concurrently on the touch panel regions 9632*a* and 9632*b*.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631*a* and the display portion 9631*b* have the same display size in FIG. 11A, one embodiment of the present invention is not limited to this example. The display portion 9631*a* and the display portion 9631*b* may have different sizes or different display quality. For example, one of them may be a display panel that can display higher-definition images than the other.

FIG. 11B illustrates the tablet terminal folded, which includes the housing 9630, a solar cell 9633, a charge and discharge control circuit 9634, a battery 9635, and a DCDC converter 9636. Note that FIG. 11B shows an example in which the charge and discharge control circuit 9634 includes the battery 9635 and the DCDC converter 9636.

Since the tablet can be folded in two, the housing 9630 can be closed when the tablet is not in use. Thus, the display portions 9631*a* and 9631*b* can be protected, thereby providing a tablet with high endurance and high reliability for long-term use.

The tablet terminal illustrated in FIGS. 11A and 11B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633, which is attached on the surface of the tablet terminal, supplies electric power to a touch panel, a display portion, an image signal processor, and the like. Note that the solar cell 9633 can be provided on one or both surfaces of the housing 9630, so that the battery 9635 can be charged efficiently. When a lithium ion battery is used as the battery 9635, there is an advantage of downsizing or the like.

Figure 11C:
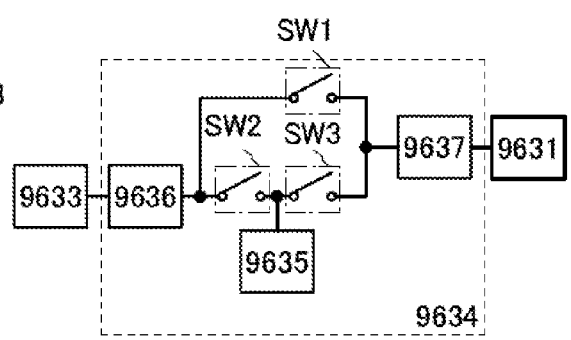

The structure and operation of the charge and discharge control circuit 9634 illustrated in FIG. 11B are described with reference to a block diagram of FIG. 11C. The solar cell 9633, the battery 9635, the DCDC converter 9636, a converter 9637, switches SW1 to SW3, and the display portion 9631 are illustrated in FIG. 11C, and the battery 9635, the DCDC converter 9636, the converter 9637, and the switches SW1 to SW3 correspond to the charge and discharge control circuit 9634 illustrated in FIG. 11B.

First, an example of operation in the case where power is generated by the solar cell 9633 using external light is described. The voltage of power generated by the solar cell is raised or lowered by the DCDC converter 9636 so that a voltage for charging the battery 9635 is obtained. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging unit may be used in combination.

Figure 12A:
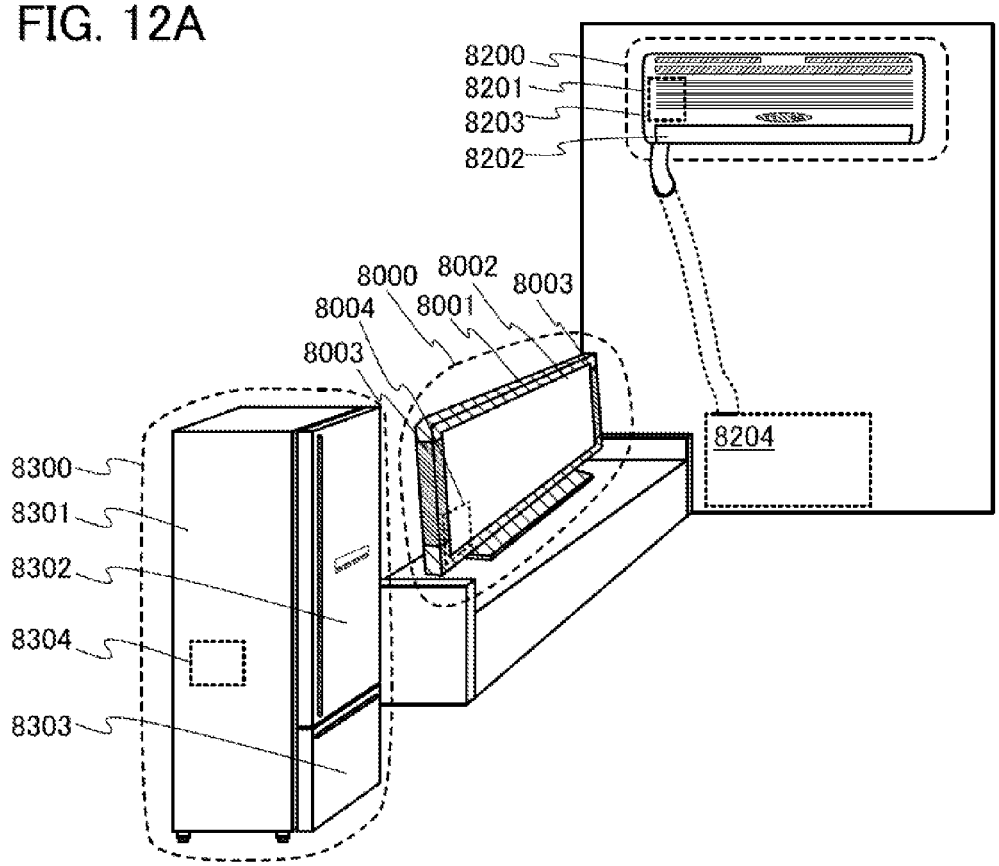
FIGS. 12A to 12C illustrate electronic devices.

In a television set 8000 in FIG. 12A, a display portion 8002 is incorporated in a housing 8001. The display portion 8002 displays an image and a speaker portion 8003 can output sound. Any of the transistors described in Embodiments 1 and 2 can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. Any of the memories and the CPU described in Embodiments 3 to 5 can be used for the television set 8000.

In FIG. 12A, an air conditioner which includes an indoor unit 8200 and an outdoor unit 8204 is an example of an electric device in which the CPU of Embodiment 5 is used. Specifically, the indoor unit 8200 includes a housing 8201, an air outlet 8202, a CPU 8203, and the like. Although the CPU 8203 is provided in the indoor unit 8200 in FIG. 12A, the CPU 8203 may be provided in the outdoor unit 8204. Alternatively, the CPU 8203 may be provided in both the indoor unit 8200 and the outdoor unit 8204. Since the CPU of Embodiment 5 is formed using an oxide semiconductor, an air conditioner which has excellent heat resistance property and high reliability can be provided with use of the CPU.

In FIG. 12A, an electric refrigerator-freezer 8300 is an example of an electric device which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 12A, the CPU 8304 is provided in the housing 8301. When the CPU described in Embodiment 5 is used as the CPU 8304 of the electric refrigerator-freezer 8300, power saving can be achieved.

Figure 12B:
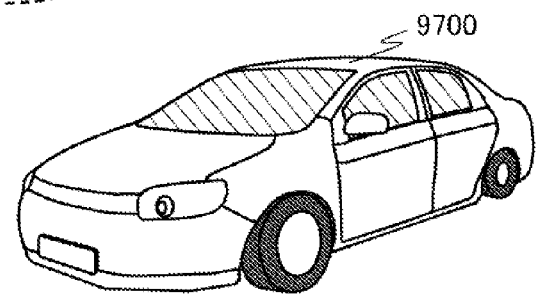
Figure 12C:
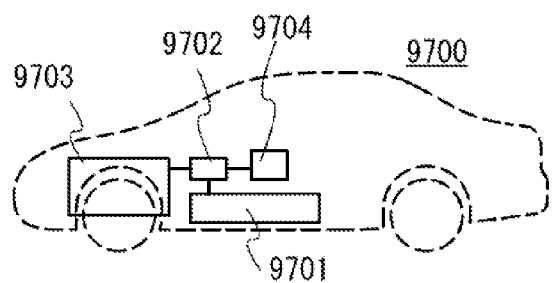

FIG. 12B illustrates an example of an electric vehicle which is an example of an electric device. An electric vehicle 9700 is equipped with a secondary battery 9701 (see in FIG. 12C). The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the CPU described in Embodiment 5 is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The methods and structures described in this embodiment can be combined as appropriate with any of the methods and structures described in the other embodiments.

EXAMPLE

The transistor described in Embodiment 2 was fabricated, and the electric characteristics were evaluated in this example.

A method for manufacturing the transistors used in this example will be described below. In this example, a transistor having a structure similar to that of the transistor 422 shown in Embodiment 2 was fabricated.

First, a silicon substrate was carried into a sputtering apparatus, and reverse sputtering was performed for 3 minutes in an argon atmosphere (the flow of argon: 50 sccm) with the pressure of 0.6 Pa and the electric power (power output) of 200 W to planarize a surface of the silicon substrate. After that, as a base insulating layer, a 1000-nm-thick silicon oxide film was successively formed by a sputtering method without being exposed to the air. Deposition conditions of the silicon oxide film were set as follows: an atmosphere was oxygen atmosphere (the flow: 50 sccm); the pressure was 0.4 Pa; electric power (power output) was 1.5 kW; the distance between the silicon substrate and a target was 60 mm; and the substrate temperature was 100° C.

Next, CMP treatment was performed on the base insulating layer to planarize a surface thereof. The conditions of the CMP treatment were set as follows: polishing pad for CMP was polyurethane-based polishing cloth; slurry was NP8020 (produced by Nitta Haas Incorporated) in undiluted form (a grain size of silica of 60 nm to 80 nm); the slurry temperature was room temperature; the polishing pressure was 0.01 MPa; the number of rotations of a table where the polishing cloth was fixed was 56 rpm; and the number of spindle rotations on a side where the substrate was fixed was 60 rpm. The treatment time was 2 minutes.

Next, as an oxide semiconductor layer, a 20-nm-thick IGZO film was formed by a sputtering method over the base insulating layer with use of an oxide target where In:Ga:Zn=3:1:2 [atomic ratio]. Deposition conditions were as follows: an atmosphere contained argon and oxygen (argon:oxygen=30 sccm:15 sccm); the pressure was 0.4 Pa; the electric power was 0.5 kW; and the substrate temperature was 200° C.

Next, oxygen ions were implanted into the oxide semiconductor layer by an ion implantation method. The conditions of the oxygen ion implantation were set as follows: acceleration voltage, 50 kV; dosage, $2.0 \times 10^{16}$ ions/cm$^2$; tilt angle, 7°; and twist angle, 72°.

Next the oxide semiconductor layer was processed into an island shape by an inductively coupled plasma (ICP) etching method. Etching conditions were set as follows: the etching gas was a mixed gas of boron trichloride and chlorine ($BCl_3:Cl_2=60$ sccm:20 sccm); the electric power was 450 W; the bias power was 100 W; and the pressure was 1.9 Pa.

Next, as a gate insulating layer, a 20-nm-thick silicon oxynitride film was formed by a CVD method over the island-shaped oxide semiconductor layer.

A gate electrode layer was formed by stacking a 30-nm-thick tantalum nitride film and a 70-nm-thick tungsten film, which were deposited by a sputtering method, over the gate insulating layer and then processing the stack by an etching method. Deposition conditions of the tantalum nitride film were set as follows: the atmosphere was a mixed atmosphere containing argon and nitrogen (Ar:$N_2$=50 sccm:10 sccm); the pressure was 0.6 Pa; and the electric power was 1 kW. Deposition conditions of the tungsten film were set as follows: the atmosphere was an argon atmosphere (the flow of 100 sccm); the pressure was 2.0 Pa; the electric power was 4 kW; and the flow rate of heated argon gas which was introduced to heat the substrate was 10 sccm.

Etching conditions of the tantalum nitride film and the tungsten film were as follows. The tungsten film was etched under a first etching condition where the etching gas was a mixed gas of chlorine, tetrafluoromethane, and oxygen ($Cl_2$:$CF_4$:$O_2$=45 sccm:55 sccm:55 sccm), the electric power was 3 kW, the bias power was 110 W, the pressure was 0.67 Pa, and the substrate temperature was 40° C. Then, the tantalum nitride was etched under a second etching condition where the etching gas was a chlorine gas ($Cl_2$=100 sccm), the electric power was 2 kW, and the bias power was 50 W.

Next, as a first insulating layer, a silicon oxynitride film was formed to have a thickness of 50 nm by a CVD method over the gate insulating layer so as to cover the gate electrode layer.

Next, phosphorus (P) ions were implanted into the oxide semiconductor layer by an ion implantation method through the first insulating layer with the use of the gate electrode layer as a mask, so that impurity regions and a channel formation region were formed in a self-aligned manner. The conditions of the phosphorus (P) ion implantation were set as follows: acceleration voltage, 70 kV; dosage, $3.0 \times 10^{15}$ ions/$cm^2$; tilt angle, 7°; and twist angle, 72°.

Next, as a second insulating layer, a silicon oxynitride film was formed to have a thickness of 410 nm by a CVD method.

The silicon oxynitride film over the gate electrode layer was partly removed by CMP treatment to decrease in thickness by 100 nm, and then the silicon oxynitride was etched, so that a sidewall insulating layer was formed on a side surface of the gate electrode layer. The conditions of the CMP treatment were set as follows: polishing pad for CMP was polyurethane-based polishing cloth; slurry was NP8020 (produced by Nitta Haas Incorporated) in undiluted form (a grain size of silica of 60 nm to 80 nm); the slurry temperature was room temperature; the polishing pressure was 0.08 MPa; the number of spindle rotations on a side where the substrate was fixed was 51 rpm; and the number of rotations of a table where the polishing cloth was fixed was 50 rpm. The treatment time was 0.8 minutes.

Further, an ICP etching method was used for the etching of the silicon oxynitride film. The etching conditions were as follows: the etching gas was a mixed gas of trifluoromethane, helium, and methane ($CHF_3$:He:$CH_4$=22.5 sccm:127.5 sccm:5 sccm); the electric power was 475 W; the bias power was 300 W; and the pressure was 3.5 Pa.

Next, as a conductive film that is to be a source electrode layer and a drain electrode layer, a 30-nm thick tungsten film was formed. The deposition conditions of the tungsten film were as follows: the atmosphere was an argon atmosphere (the flow rate: 80 sccm); the pressure was 0.8 Pa; the electric power was 1 kW; and the flow rate of heated argon gas which was introduced to heat the substrate was 10 sccm.

Then, a region of the tungsten film, which did not overlap with the gate electrode layer, was etched selectively. The etching conditions of the tungsten film were as follows: the etching gas was a mixed gas of chlorine, tetrafluoromethane, and oxygen ($Cl_2$:$CF_4$:$O_2$=45 sccm:55 sccm:50 sccm); the electric power was 3000 W; the bias power was 110 W; the pressure was 0.67 Pa; and the substrate temperature was 40° C.

As an insulating layer, a 70-nm-thick aluminum oxide film and a 460-nm-thick silicon oxynitride film were stacked over the conductive film. The aluminum oxide film was deposited by a sputtering method under the following conditions: the atmosphere was a mixed atmosphere of an argon gas and an oxygen gas (Ar:$O_2$=25 sccm:25 sccm); the pressure was 0.4 Pa; the electric power (power output) was 2.5 kW; the distance between the substrate and a target was 60 mm; and the substrate temperature was 250° C. Further, the silicon oxynitride film was deposited by a CVD method.

A region of the tungsten film, which overlapped with the gate electrode layer, was removed by CMP treatment, so that a source electrode layer and a drain electrode layer were formed. The conditions of the CMP treatment were set as follows: polishing pad for CMP was polyurethane-based polishing cloth; slurry was NP8020 (produced by Nitta Haas Incorporated) in undiluted form (a grain size of silica of 60 nm to 80 nm); the slurry temperature was room temperature; the polishing pressure was 0.08 MPa; the number of spindle rotations on a side where the substrate was fixed was 51 rpm; and the number of rotations of a table where the polishing cloth was fixed was 50 rpm. The treatment time was 2 minutes.

Over the source electrode layer and the drain electrode layer, a silicon oxynitride film was formed to have a thickness of 400 nm by a CVD method.

Heat treatment was performed at 400° C. for 1 hour in an oxygen atmosphere, and then, an opening reaching the impurity region in the oxide semiconductor layer was formed. A 50-nm-thick titanium film, a 300-nm-thick aluminum film, and a 50-nm-thick titanium film were formed in the opening by a sputtering method and then processed by etching, so that a wiring layer was formed. The deposition conditions of the titanium film were as follows: the atmosphere was an argon atmosphere (flow rate of Ar: 20 sccm); the pressure was 0.1 Pa; and the electric power was 1 kW. Further, the deposition conditions of the aluminum film were as follows: the atmosphere was an argon atmosphere (flow rate of Ar: 50 sccm); the pressure was 0.4 Pa; and the electric power was 1 kW. Furthermore, the etching conditions were set as follows: the etching gas was a mixed gas of boron trichloride and chlorine ($BCl_3$:$Cl_2$=60 sccm:20 sccm); the electric power was 450 W; the bias power was 100 W; and the pressure was 1.9 Pa.

After that, a polyimide film was formed to a thickness of 1.5 μm by a coating method and subjected to heat treatment at 300° C. in the atmospheric atmosphere for 1 hour.

Through the above process, Transistor A (transistors A1, A2, and A3) of this example was fabricated. In this example, the transistor A1 has a channel length (L) of 0.1 μm and a channel width (W) of 10 μm; the transistor A2 has a channel length (L) of 0.35 μm and a channel width (W) of 10 μm; and the transistor A3 has a channel length (L) of 9.8 μm and a channel width (W) of 10 μm.

In addition, as a comparative example, Comparative Transistor B (transistors B1, B2, and B3) which was not subjected to introduction of an impurity and included no impurity region in an oxide semiconductor layer was fabricated. In formation of Comparative Transistor B, a 460-nm-thick silicon oxynitride film was deposited by a CVD method after a gate insulating layer was formed, and a sidewall insulating layer was formed using the silicon oxynitride film. The other fabrication steps were similar to those of Transistor A. In this example, the transistor B1 has a channel length (L) of 0.1 μm and a channel width (W) of 10 μm; the transistor B2 has a channel length (L) of 0.35 μm and a channel width (W) of 10 μm; and the transistor B3 has a channel length (L) of 9.8 μm and a channel width (W) of 10 μm.

Figure 15A:
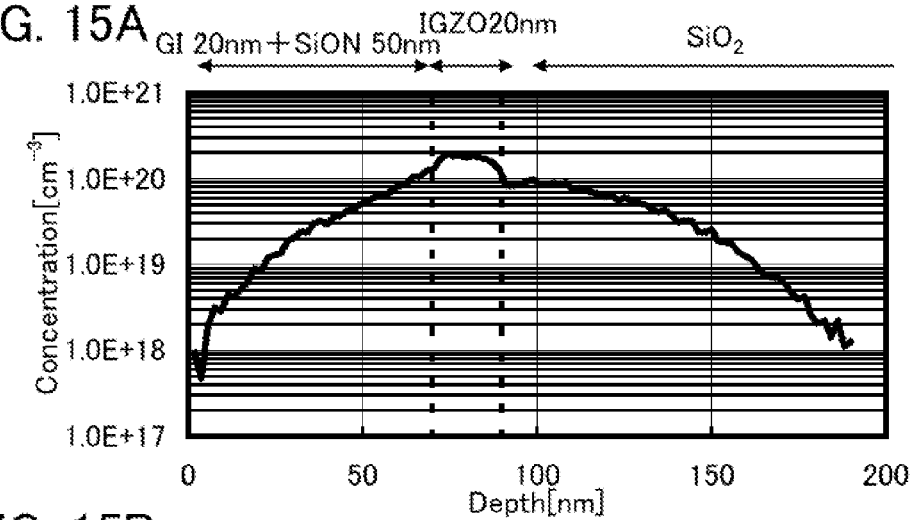
FIGS. 15A to 15C show calculation results of the amount of impurity elements implanted in the depth direction under the implantation conditions of Example.
Figure 15B:
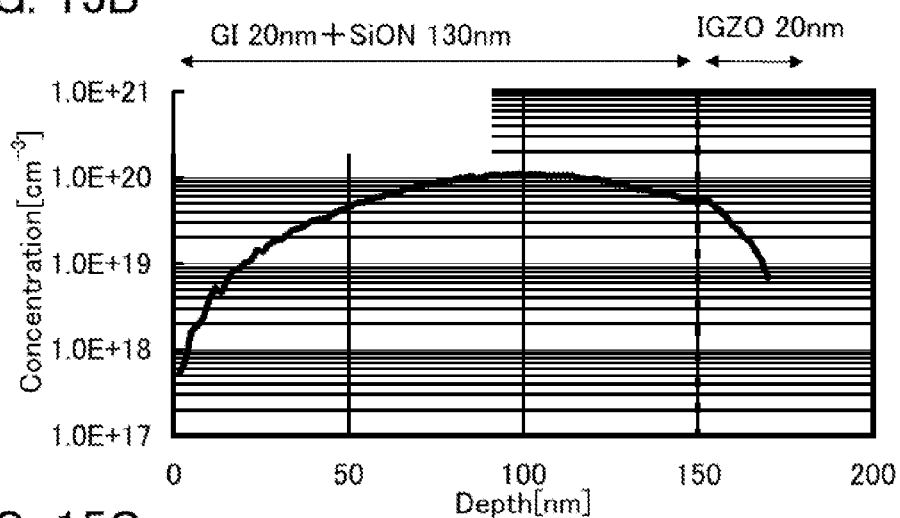
Figure 15C:
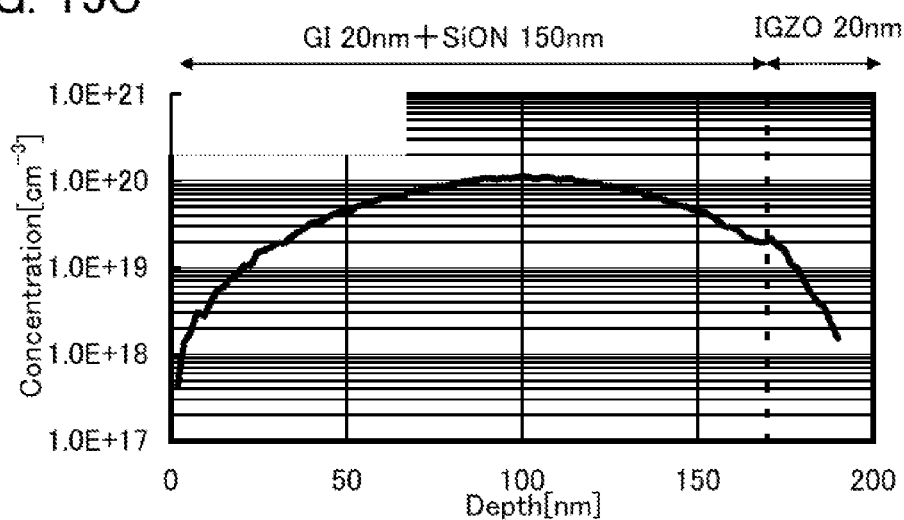

FIGS. 15A to 15C show calculation results of the amount of impurity elements implanted in the depth direction in the case where an impurity element (P) was implanted under the implantation conditions of this example. For the calculation, transport of ions in matter (TRIM) was used. TRIM is software for calculation of ion introducing process by a Monte Carlo method.

Note that in the calculation, the film density of the silicon oxynitride film was 2.2 g/cm$^3$.

FIG. 15A shows a concentration profile of the impurity element in a region where the thickness of the first insulating layer provided over the gate insulating layer is 50 nm. FIG. 15B shows a concentration profile of the impurity element in a region where the thickness of the first insulating layer provided over the gate insulating layer is 130 nm, which is in the vicinity of the side surface of the gate electrode layer. FIG. 15C shows a concentration profile of the impurity element in a region where the thickness of the first insulating layer provided over the gate insulating layer is 150 nm (i.e., region where the thickness is increased by the thickness of the gate electrode layer), which is closer to the side surface of the gate electrode layer than the region of FIG. 15B.

According to FIGS. 15A to 15C, it is found that by introduction of the impurity element through the first insulating layer with a variation in thickness, the concentration of impurity contained in the oxide semiconductor layer is varied. In this example, in the impurity region formed in the oxide semiconductor layer, the concentration of the impurity element becomes lower as closer to the channel formation region, and the peak of the concentration profile in the depth direction appears at a shallower portion as the calculated region is close to the channel formation region. Further, it is found that the impurity element is introduced into the first insulating layer in the vicinity of the side surface of the gate electrode layer. In this example, the highest concentration of the impurity contained in the first insulating layer was a value equivalent to that of the highest concentration of the impurity contained in the oxide semiconductor layer.

In Transistor A, the resistance of the source or the drain was 4.4×10$^3$ Ω/μm, and the contact resistance between the oxide semiconductor layer and the source or drain electrode layer was 6.3×10$^3$ Ω per micrometer of channel width. On the other hand, in Comparative Transistor B, the resistance of the source or the drain was 1.2×10$^{14}$ Ω/μm, and the contact resistance between the oxide semiconductor layer and the source or drain electrode layer was 1.6×10$^6$ Ω per micrometer of channel width. Thus, it was found that Transistor A is a transistor whose parasitic resistance value is much smaller than that of Comparative Transistor B including no impurity region.

Figure 16:
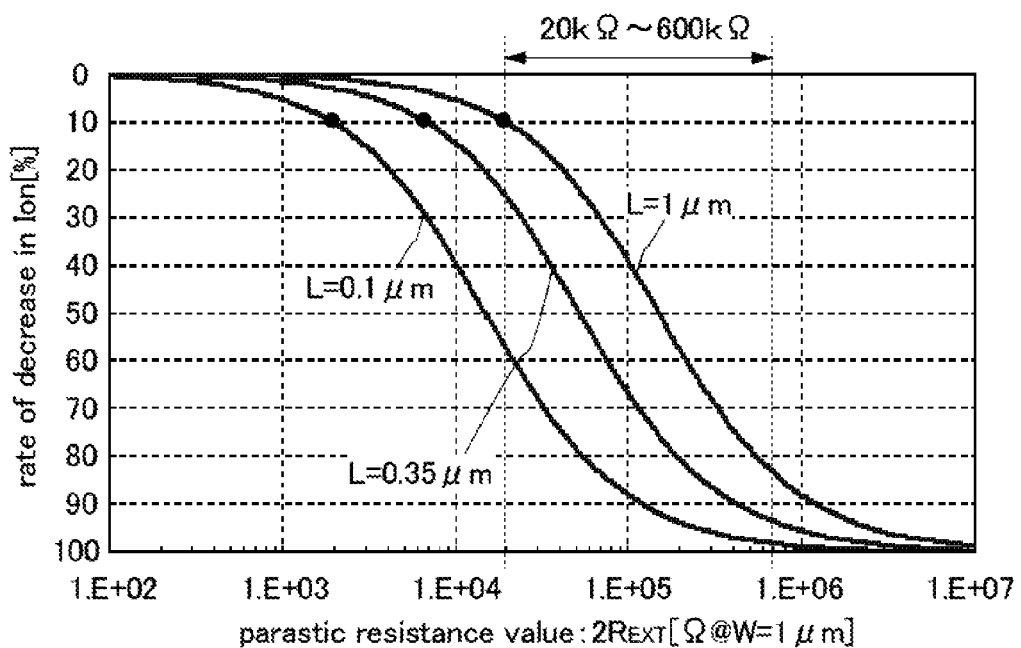
FIG. 16 is a graph showing calculation results of the decreasing rate of the on-state current with respect to the parasitic resistance.

FIG. 16 shows the rate of decrease in on-state current with respect to the parasitic resistance calculated on the assumption that the channel width (W) was 1 μm, the thickness of the semiconductor layer was 20 nm, the channel length (L) was 0.1 μm, 0.35 μm, or 1 μm, the gate voltage (V$_g$) was 2.7 V, the drain voltage (V$_d$) was 1 V, and the mobility was 20 cm$^2$/Vs. In FIG. 16, the parasitic resistance value (R$_{EXT}$) is a value obtained by doubling the sum of the resistance of the source or drain (R$_{S/D}$) and the contact resistance between the electrode and the semiconductor layer (R$_C$). Further, the rate of decrease in the on-state current (I$_{on}$) is obtained by the following formula (1).

$$\text{Rate of decrease in } I_{on} = \left(1 - \frac{I_{on} \text{ with parastic resistance}}{I_{on} \text{ without parastic resistance}}\right) \times 100$$

In general, the parasitic resistance value of the actual device is supposed to be 20 kΩ/μm to 600 kΩ/μm. Thus, the required parasitic resistance value is as follows: 2.0 kΩ/μm or lower in the case where the channel length (L) is 0.1 μm; 7.0 kΩ/μm or lower in the case where the channel length (L) is 0.35 μm; and 21 kΩ/μm or lower in the case where the channel length (L) is 1 μm.

The transistors A1, A2, and A3 described in this example satisfy the required value of the above parasitic resistance, which indicates that the parasitic resistance value in the transistor of this example is reduced.

The results of the electric characteristic evaluation of the transistors which were formed are shown in FIGS. 13A to 13C and FIGS. 14A to 14C.

Figure 13A:
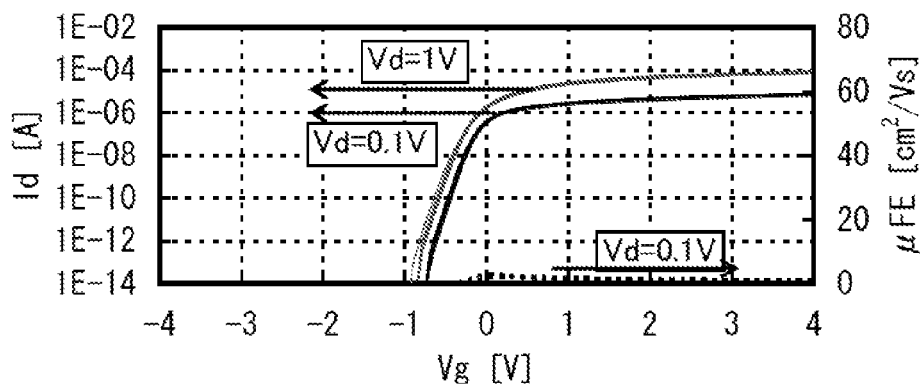
FIGS. 13A to 13C show evaluation results of electric characteristics of transistors fabricated in Example.
Figure 13B:
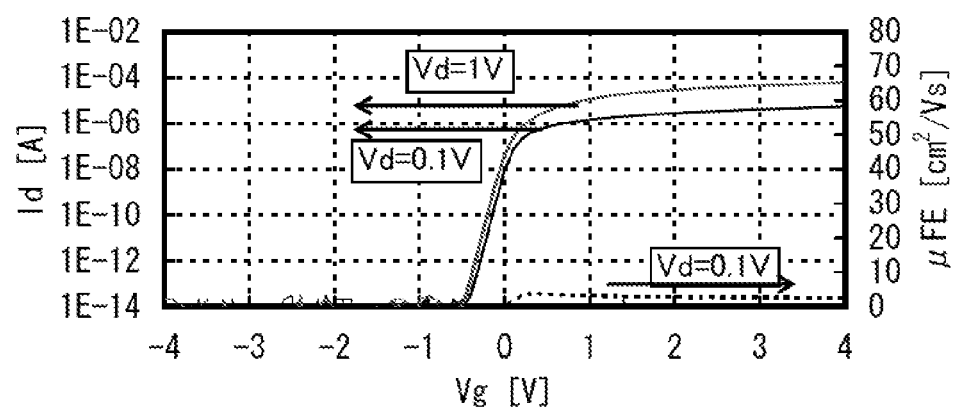
Figure 13C:
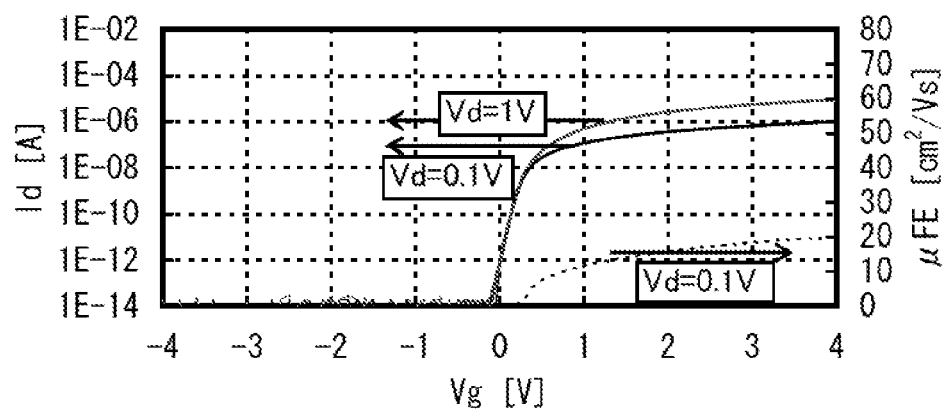

FIG. 13A shows the evaluation result of the electric characteristics of the transistor B1, FIG. 13B shows the evaluation result of the electric characteristics of the transistor B2, and FIG. 13C shows the evaluation result of the electric characteristics of the transistor B3. FIGS. 13A to 13C each show the gate voltage (V$_g$)-drain current (I$_d$) when the drain voltage (V$_d$) is 1 V or 0.1 V and also show field-effect mobility when the drain voltage (V$_d$) is 0.1 V.

Figure 14A:
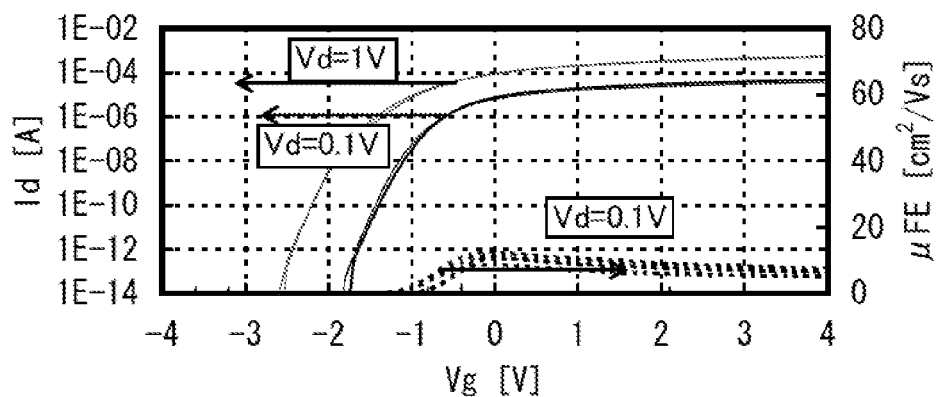
FIGS. 14A to 14C show evaluation results of electric characteristics of transistors fabricated in Example.
Figure 14B:
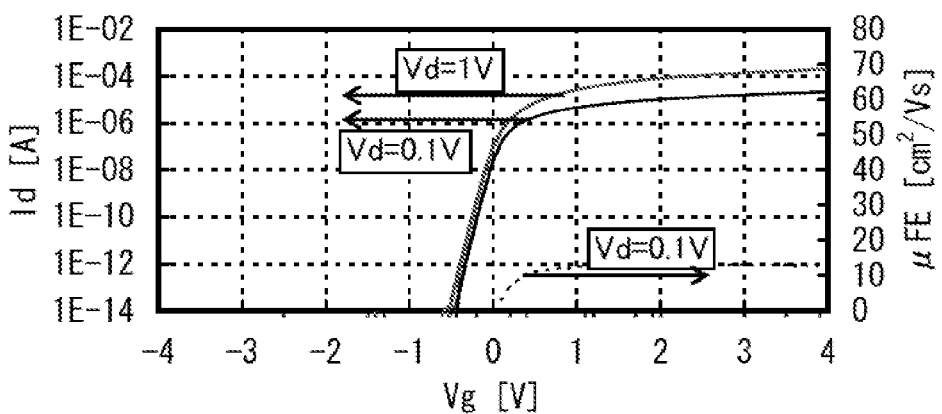
Figure 14C:
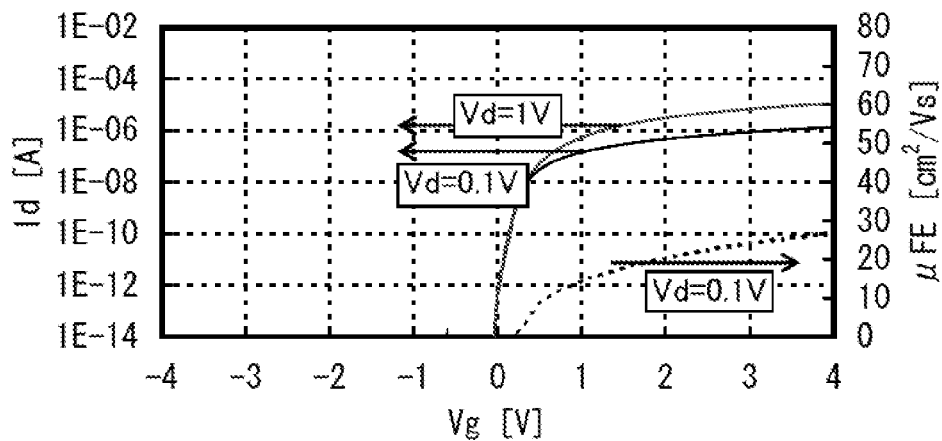

FIG. 14A shows the evaluation result of the electric characteristics of the transistor A1, FIG. 14B shows the evaluation result of the electric characteristics of the transistor A2, and FIG. 14C shows the evaluation result of the electric characteristics of the transistor A3. FIGS. 14A to 14C each show the gate voltage (V$_g$)-drain current (I$_d$) when the drain voltage (V$_d$) is 1 V or 0.1 V and also show field-effect mobility when the drain voltage (V$_d$) is 0.1 V.

In the case where Comparative Transistor B has a drain voltage of 1 V and a gate voltage of 3 V, the median value of the on-state current (the number of samples: 13) was 63 μA, 42 μA, and 4.7 μA in the transistor B1, the transistor B2, and the transistor B3, respectively. In the case where Transistor A has a drain voltage of 1 V and a gate voltage of 3 V, the median value of the on-state current (the number of samples: 13) was 420 μA, 120 μA, and 5.6 μA in the transistor A1, the transistor A2, and the transistor A3, respectively; it is higher than the case of Comparative Transistor B.

Further, in the case where Comparative Transistor B has a drain voltage of 0.1 V, the median value of the field-effect mobility (the number of samples: 13) was 2.6 cm$^2$/Vs, 3.5 cm$^2$/Vs, and 20 cm$^2$/Vs in the transistor B1, the transistor B2, and the transistor B3, respectively. In the case where Transistor A has a drain voltage of 0.1 V, the median value of the field-effect mobility (the number of samples: 13) was 11 cm$^2$/Vs, 11 cm$^2$/Vs, and 26 cm$^2$/Vs in the transistor A1, the transistor A2, and the transistor A3, respectively; it is higher than the case of Comparative Transistor B.

The above results suggest that the transistors in this example have extremely high electric characteristics.

This application is based on Japanese Patent Application serial no. 2012-044266 filed with Japan Patent Office on Feb. 29, 2012, the entire contents of which are hereby incorporated by reference.

What is claimed is:

1. A method for manufacturing a semiconductor device comprising the steps of:
    forming a base insulating film;
    forming an oxide semiconductor layer over the base insulating film;
    forming a gate insulating layer over the oxide semiconductor layer;
    forming a gate electrode layer to overlap with the oxide semiconductor layer with the gate insulating layer interposed therebetween;
    forming a first insulating layer to cover the gate insulating layer and the gate electrode layer;
    introducing an impurity element through the first insulating layer to form a pair of impurity regions in the oxide semiconductor layer;
    forming a second insulating layer over the first insulating layer;
    etching the first insulating layer and the second insulating layer to form a sidewall insulating layer in contact with a side surface of the gate electrode layer;
    forming a conductive layer over the oxide semiconductor layer, the sidewall insulating layer, the gate electrode layer, and the base insulating film;
    etching the conductive layer, wherein an etched conductive layer covers the oxide semiconductor layer, the sidewall insulating layer, and the gate electrode layer; and
    polishing the etched conductive layer to remove the etched conductive layer that overlaps with the gate electrode layer, thereby forming a source electrode layer and a drain electrode layer.

2. The method for manufacturing a semiconductor device according to claim 1, wherein the oxide semiconductor layer includes a microcrystal.

3. The method for manufacturing a semiconductor device according to claim 1, wherein the oxide semiconductor layer includes indium, gallium, and zinc.

4. The method for manufacturing a semiconductor device according to claim 1, wherein an oxide vacancy is formed in the pair of impurity regions.

5. The method for manufacturing a semiconductor device according to claim 1, wherein the sidewall insulating layer includes the impurity element.

6. The method for manufacturing a semiconductor device according to claim 1, wherein the sidewall insulating layer comprises the first insulating layer and the second insulating layer.

7. The method for manufacturing a semiconductor device according to claim 1, wherein a thickness of the second insulating layer is larger than a thickness of the first insulating layer.

8. The method for manufacturing a semiconductor device according to claim 1, wherein a chemical mechanical polishing treatment is used in the polishing step.

9. The method for manufacturing a semiconductor device according to claim 1, wherein the oxide semiconductor layer has a stacked structure.

10. The method for manufacturing a semiconductor device according to claim 1, further comprising the steps of:
    forming a fourth insulating layer over the source electrode layer and the drain electrode layer; and
    forming a source wiring layer and a drain wiring layer over the fourth insulating layer, the source wiring layer being in contact with the source electrode layer, the drain wiring layer being in contact with the drain electrode layer.

11. A method for manufacturing a semiconductor device comprising the steps of:
    forming a base insulating film;
    forming an oxide semiconductor layer over the base insulating film;
    forming a gate insulating layer over the oxide semiconductor layer;
    forming a gate electrode layer to overlap with the oxide semiconductor layer with the gate insulating layer interposed therebetween;
    forming a first insulating layer to cover the gate insulating layer and the gate electrode layer;
    introducing an impurity element through the first insulating layer to form a pair of impurity regions in the oxide semiconductor layer;
    forming a second insulating layer over the first insulating layer;
    etching the first insulating layer and the second insulating layer to form a sidewall insulating layer in contact with a side surface of the gate electrode layer;
    forming a conductive layer over the oxide semiconductor layer, the sidewall insulating layer, the gate electrode layer, and the base insulating film;
    etching the conductive layer, wherein an etched conductive layer covers the oxide semiconductor layer, the sidewall insulating layer, and the gate electrode layer;
    forming a third insulating layer over the etched conductive layer, the third insulating layer being in contact with the base insulating film; and
    polishing the etched conductive layer and the third insulating layer to remove the etched conductive layer that overlaps with the gate electrode layer, thereby forming a source electrode layer and a drain electrode layer.

12. The method for manufacturing a semiconductor device according to claim 11, wherein the oxide semiconductor layer includes a microcrystal.

13. The method for manufacturing a semiconductor device according to claim 11, wherein the oxide semiconductor layer includes indium, gallium, and zinc.

14. The method for manufacturing a semiconductor device according to claim 11, wherein an oxide vacancy is formed in the pair of impurity regions.

15. The method for manufacturing a semiconductor device according to claim 11, wherein the sidewall insulating layer includes the impurity element.

16. The method for manufacturing a semiconductor device according to claim 11, wherein the sidewall insulating layer comprises the first insulating layer and the second insulating layer.

17. The method for manufacturing a semiconductor device according to claim 11, wherein a thickness of the second insulating layer is larger than a thickness of the first insulating layer.

18. The method for manufacturing a semiconductor device according to claim 11, wherein a chemical mechanical polishing treatment is used in the polishing step.

19. The method for manufacturing a semiconductor device according to claim 11, wherein the oxide semiconductor layer has a stacked structure.

20. The method for manufacturing a semiconductor device according to claim 11, further comprising the steps of:

forming a fourth insulating layer over the source electrode layer and the drain electrode layer; and forming a source wiring layer and a drain wiring layer over the fourth insulating layer, the source wiring layer being in contact with the source electrode layer, the drain wiring layer being in contact with the drain electrode layer.

21. The method for manufacturing a semiconductor device according to claim 1, wherein the base insulating film comprises a region containing oxygen in excess of a stoichiometric composition.

22. The method for manufacturing a semiconductor device according to claim 11, wherein the base insulating film comprises a region containing oxygen in excess of a stoichiometric composition.

* * * * *